(12) United States Patent
Gu et al.

(10) Patent No.: US 12,310,204 B2
(45) Date of Patent: May 20, 2025

(54) DISPLAY PANEL AND DISPLAY APPARATUS

(71) Applicant: WUHAN TIANMA MICROELECTRONICS CO., LTD., Wuhan (CN)

(72) Inventors: Jiachang Gu, Wuhan (CN); Chujie Yu, Wuhan (CN); Tao Peng, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 428 days.

(21) Appl. No.: 17/833,696

(22) Filed: Jun. 6, 2022

(65) Prior Publication Data

US 2022/0302245 A1 Sep. 22, 2022

(30) Foreign Application Priority Data

Feb. 28, 2022 (CN) .......................... 202210187292.9

(51) Int. Cl.
*H10K 59/131* (2023.01)
*H10H 29/14* (2025.01)
*H10K 59/121* (2023.01)

(52) U.S. Cl.
CPC ....... *H10K 59/1315* (2023.02); *H10H 29/142* (2025.01); *H10K 59/121* (2023.02)

(58) Field of Classification Search
CPC ............. H10K 59/1315; H10K 59/121; H10K 50/805; H10K 50/844; H10K 50/8426; H10K 77/111; H10K 59/122; H10K 59/131; H10K 59/00; H10K 59/8791; H10K 59/8722; H10K 59/871; H10K 2102/311; H01L 27/156; H01L 27/3279; G06F 3/0414; G06F 3/04144; G06F 1/1643; G06F 1/1652; G06F 1/1618; G06F 1/1641; G06F 2203/04102; G09G 3/3266; G09G 3/3233; G09G 3/3275; G09G 2310/0264; G09F 9/301; Y02E 10/549
USPC ..................................................... 257/40, 72
See application file for complete search history.

(56) References Cited

FOREIGN PATENT DOCUMENTS

| CN | 112420775 A | | 2/2021 | |
|---|---|---|---|---|
| EP | 4152401 A1 | * | 3/2023 | ........... H10K 59/131 |

* cited by examiner

*Primary Examiner* — Jasmine J Clark
(74) *Attorney, Agent, or Firm* — CHRISTENSEN O'CONNOR JOHNSON KINDNESS PLLC

(57) ABSTRACT

Provided is a display panel, including: a substrate; a display region; and a non-display region having a first region and including: first and second power lines; a first conductive block electrically connected to the first power line; and a second conductive block electrically connected to the second power line. The first region and the display region are arranged along a first direction. In the first region, the first conductive block includes first and second portions, and the second conductive block includes third and fourth portions. The first portion and the third portion are located in first conductive layer, and the second portion and the fourth portion are located in second conductive layer. The first portion is spaced from the third portion, the second portion is spaced from the fourth portion, and the fourth portion at least partially overlaps with the first portion along a direction perpendicular to the substrate.

20 Claims, 22 Drawing Sheets

DISPLAY PANEL AND DISPLAY APPARATUS

CROSS-REFERENCE TO RELATED APPLICATION

The present application claims the benefit of Chinese Patent Application No. 202210187292.9, filed on Feb. 28, 2022, the content of which is incorporated herein by reference in its entirety.

TECHNICAL FIELD

The present disclosure relates to the field of display technologies and, particularly, relates to a display panel and a display apparatus.

BACKGROUND

With consumer's increasing display requirements, narrow-border display screens are popular since they can provide a better user experience. However, conventionally, functional circuits, peripheral traces, binding printed circuit boards, and the like are required to be provided in a peripheral circuit region of a display panel, especially at a lower side, and left and right borders of the display panel. Functional circuits, signal leads, binding pins, and other components are provided this region. When designing a narrow border, there is presently a need for better arranged peripheral circuit regions that improve reliability of the display panel.

SUMMARY

In view of the above, embodiments of the present disclosure provide a display panel and a display apparatus to solve the above problem.

In a first aspect of the present disclosure, a display panel is provided. In an embodiment, the display panel includes: a substrate; a display region; and a non-display region having a first region and including: a first power line and a second power line; a first conductive block electrically connected to the first power line; and a second conductive block electrically connected to the second power line. In an embodiment, the first region and the display region are arranged along a first direction. In the first region, the first conductive block includes a first portion and a second portion, and the second conductive block includes a third portion and a fourth portion. In an embodiment, the first portion and the third portion are located in a first conductive layer, and the second portion and the fourth portion are located in a second conductive layer. In an embodiment, the first portion is spaced apart from the third portion, the second portion is spaced apart from the fourth portion, and the fourth portion at least partially overlaps with the first portion along a direction perpendicular to a plane of the substrate.

In a second aspect of the present disclosure, a display apparatus is provided. In an embodiment, the display apparatus includes the display panel as above.

In a second aspect of the present disclosure, a display apparatus is provided. In an embodiment, he display apparatus includes the display panel as above.

BRIEF DESCRIPTION OF DRAWINGS

In order to better illustrate technical solutions of embodiments of the present disclosure, the accompanying drawings used in embodiments are briefly described below. The drawings described below are merely a part of the embodiments of the present disclosure. Based on these drawings, those skilled in the art can obtain other drawings.

DESCRIPTION OF EMBODIMENTS

In order to better understand the technical solutions of the present disclosure, the embodiments of the present disclosure are described in detail below with reference to the accompanying drawings.

It should be clear that the described embodiments are only a part of the embodiments of the present disclosure, but not all of the embodiments. Based on the embodiments in the present disclosure, all other embodiments obtained by those of ordinary skill in the art without creative efforts fall within the protection scope of the present disclosure.

The terms used in the embodiments of the present disclosure are only for the purpose of describing specific embodiments, and are not intended to limit the present disclosure. As used in the embodiments of this application and the appended claims, the singular forms "a/an" "the" and "said" are intended to include the plural forms as well, unless the context clearly dictates otherwise.

It should be understood that the term "and/or" used in this document is only an association relationship to describe the associated objects, indicating that there may be three relationships, for example, A and/or B, which may indicate that A alone, A and B, and B alone. The character "/" in this document generally indicates that the related objects are an "or" relationship.

In this specification, it should be understood that words such as "basically", "approximately", "about", "substan-
tially" and "generally" described in the claims and embodiments of the present disclosure refer to a value within a reasonable technological operating ranges or tolerance ranges, which may be generally approved and is not a precise value.

It should be understood that although the terms 'first', 'second' and 'third' can be used in the present disclosure to describe conductive layers, these conductive layers should not be limited to these terms. These terms are used only to distinguish conductive layers from each other. For example, without departing from the scope of the embodiments of the present disclosure, a first conductive layer can also be referred to as a second conductive layer. Similarly, the second conductive layer can also be referred to as the first conductive layer.

Through careful and in-depth research, the applicant provides a solution to address the problems in the related art.

Figure 1:
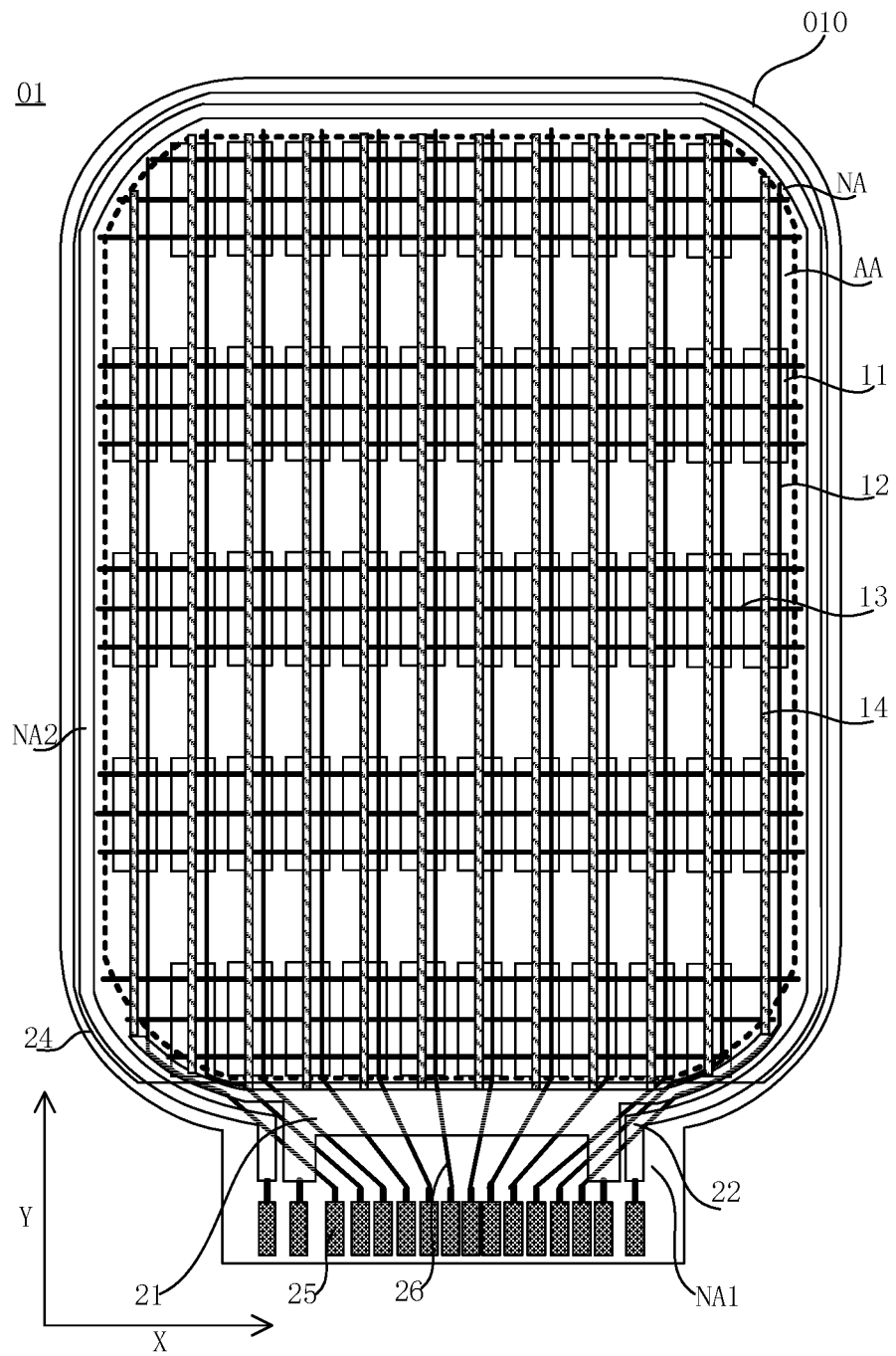
FIG. 1 is a schematic diagram of a display panel according to an embodiment of the present disclosure.
Figure 2:
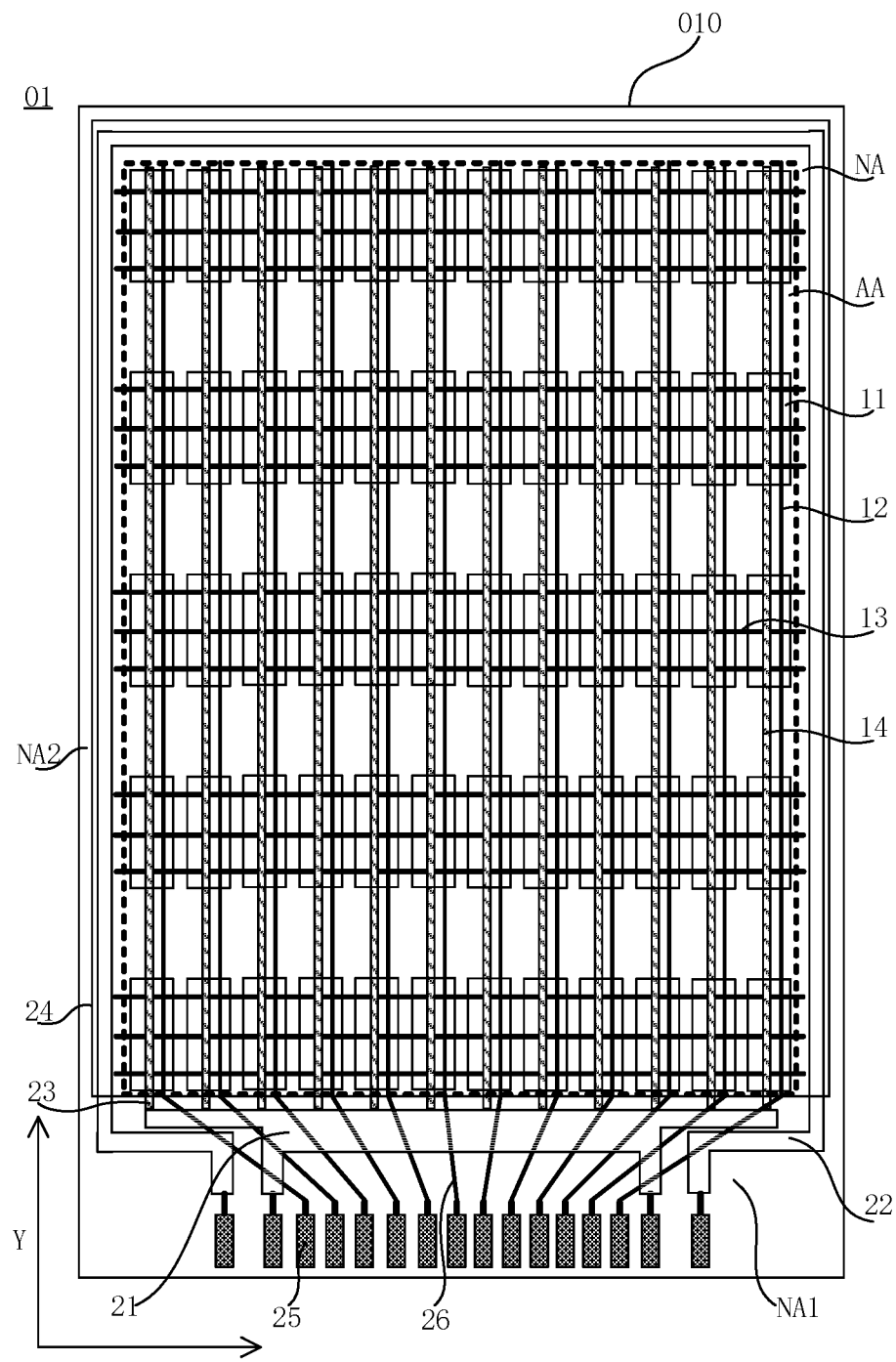
FIG. 2 is a schematic diagram of a display panel according to another embodiment of the present disclosure.

FIG. 1 is a schematic diagram of a display panel according to an embodiment of the present disclosure, and FIG. 2 is a schematic diagram of a display panel according to another embodiment of the present disclosure.

FIGS. 1 and 2 provide a display panel 01 according to an embodiment of the present disclosure. As shown in FIG. 1 and FIG. 2, the display panel 01 includes a display region AA and a non-display region NA. The display region AA is a region for light-emitting display, and the non-display region NA at least partially surrounds the display region AA and provides packaging and setting for peripheral traces and circuits. As shown in FIG. 1 and FIG. 2, a region inside a dashed block can be regarded as the display region AA, and a region surrounding the dashed block can be regarded as the non-display region NA.

The non-display region NA includes a first region NA1. The first region NA1 and the display region AA are arranged along a first direction Y. A first conductive block 21 and a second conductive block 22 are provided in the non-display region NA.

Figure 3:
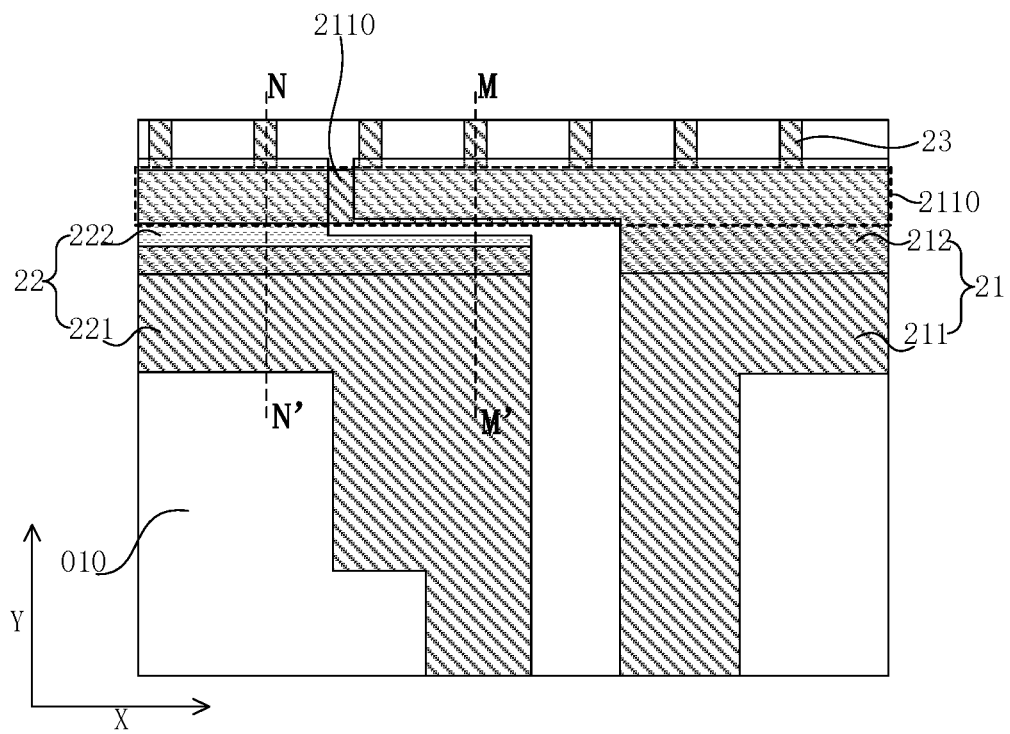
FIG. 3 is a partial enlarged view of a first region shown in FIG. 1 and FIG. 2 according to an embodiment of the present disclosure.
Figure 4:
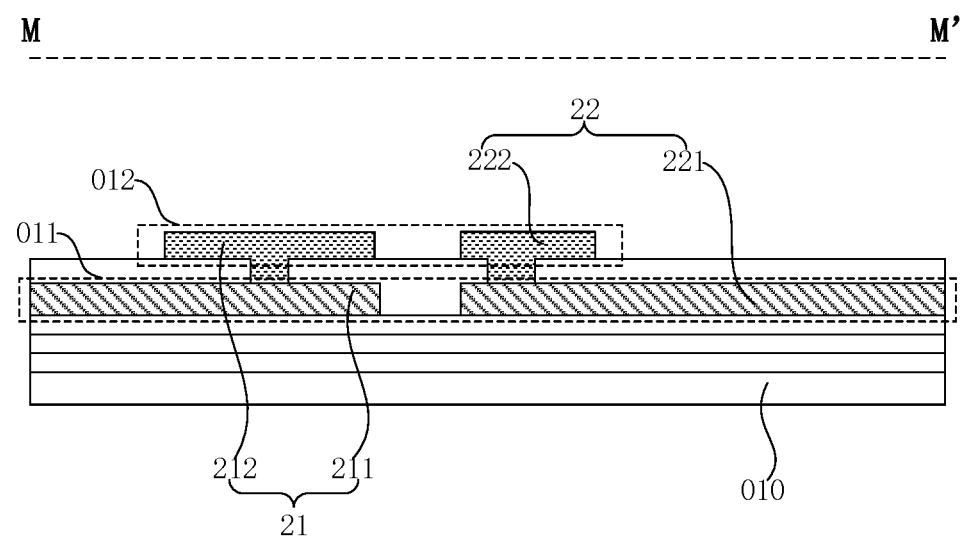
FIG. 4 is a cross-sectional view along an MM' direction shown in FIG. 3 according to an embodiment of the present disclosure.
Figure 5:
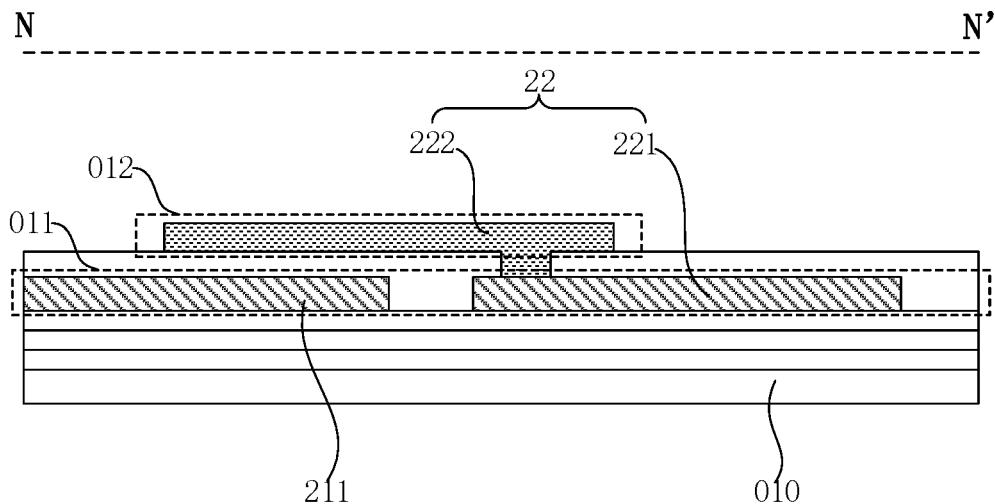
FIG. 5 is a cross-sectional view along an NN' direction shown in FIG. 3 according to an embodiment of the present disclosure.

FIG. 3 is a partial enlarged view of a first region shown in FIG. 1 and FIG. 2 according to an embodiment of the present disclosure, FIG. 4 is a cross-sectional view along an MM' direction shown in FIG. 3 according to an embodiment of the present disclosure, and FIG. 5 is a cross-sectional view along an NN' direction shown in FIG. 3 according to an embodiment of the present disclosure. In order to clearly illustrate the inventive concept of the present disclosure, some structures in the first region NA1 are omitted in FIG. 3.

Referring to FIG. 3, FIG. 4, and FIG. 5, in the first region NA1, the first conductive block 21 includes a first portion 211 and a second portion 212, and the second conductive block 22 includes a third portion 221 and a fourth portion 222. The first portion 211 and the third portion 221 are located in a first conductive layer 011. The first portion 211 is spaced apart from the third portion 221. The second portion 212 and the fourth portion 222 are located in the second conductive layer 012. The second portion 212 is spaced apart from the fourth portion 222. That is to say, the first conductive block 21 includes the first portion 211 and the second portion 212 that are located in the first conductive layer 011 and the second conductive layer 012, respectively. The second conductive block 22 includes the third portion 221 and the fourth portion 222 that are located in the first conductive layer 011 and the second conductive layer 012, respectively. The first portion 211 located in the first conductive layer 011 is electrically insulated from the third portion 221, and the second portion 212 located in the second conductive layer 012 is electrically insulated from the fourth portion 222. It can be understood that a gap is formed between an orthographic projection of the first portion 211 on the substrate 010 and an orthographic projection of the third portion 221 on the substrate 010. Moreover, a gap is formed between an orthographic projection of the second portion 212 on the substrate 010 and an orthographic projection of the fourth portion 222 on the substrate 010.

The first conductive block 21 in the first region NA1 is configured as a structure composed of multiple portions located in different conductive layers, respectively. The second conductive block 22 in the first region NA1 is configured as a structure composed of multiple portions located in different conductive layers, respectively. On the one hand, this configuration can ensure that the first conductive block 21 and the second conductive block 22 have relatively good conductivity, so that the first conductive block and the second conductive block have better signal transmission capability. On the other hand, the first conductive block 21 and the second conductive block 22 can be avoided from occupying too much area in the first region NA1 to achieve a narrow border. Multiple portions of the first conductive block 21 that are located different conductive layers can be electrically connected through contact holes, and multiple portions of the second conductive block 22 that are located different conductive layers can be electrically connected through contact holes.

In an embodiment of the present disclosure, as shown in FIG. 4 and FIG. 5, the first conductive layer 011 and the second conductive layer 012 are located at a same side of the substrate 010. The first conductive layer 011 is located at a side of the second conductive layer 012 close to the substrate 010. That is, the first portion 211 of the first conductive block 21 and the third portion 221 of the second conductive block 22 are manufactured before the second portion 212 of the first conductive block 21 and the fourth portion 222 of the second conductive block 22. The substrate 010 can include glass materials, ceramic materials, metal materials, plastic materials, or materials with flexible or bendable properties, and the like.

Figure 6:
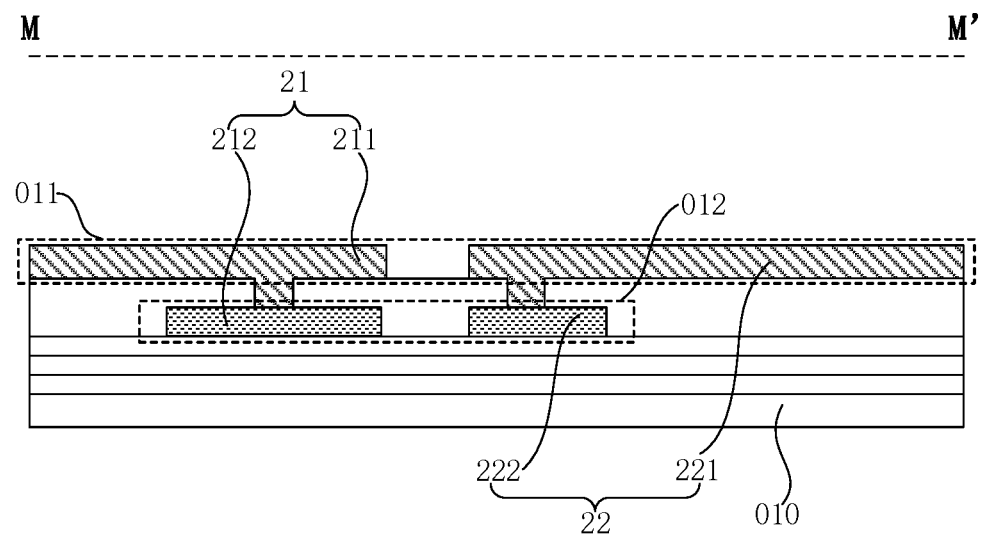
FIG. 6 is a cross-sectional view along MM' direction shown in FIG. 3 according to another embodiment of the present disclosure.
Figure 7:
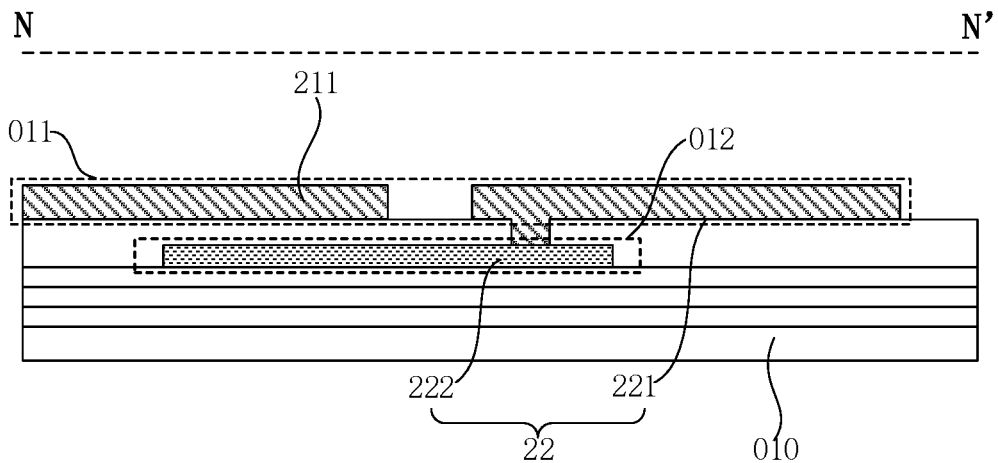
FIG. 7 is a cross-sectional view along an NN' direction shown in FIG. 3 according to another embodiment of the present disclosure.

FIG. 6 is a cross-sectional view along MM' direction shown in FIG. 3 according to another embodiment of the present disclosure, and FIG. 7 is a cross-sectional view along an NN' direction shown in FIG. 3 according to another embodiment of the present disclosure.

In another embodiment, as shown in FIG. 6 and FIG. 7, the first conductive layer 011 and the second conductive layer 012 are located at a same side of the substrate 010. The second conductive layer 012 is located at a side of the first conductive layer 011 close to the substrate 010. That is, the second portion 212 of the first conductive block 21 and the fourth portion 222 of the second conductive block 22 are manufactured before the first portion 211 of the first conductive block 21 and the third portion 221 of the second conductive block 22.

Figure 8:
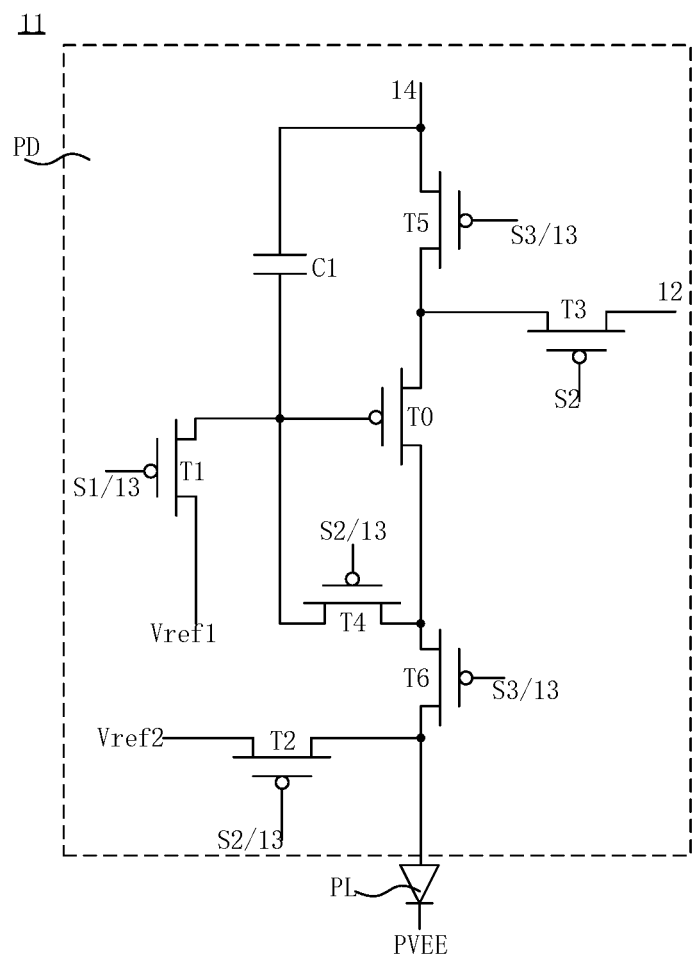
FIG. 8 is an equivalent circuit diagram of a light-emitting pixel according to an embodiment of the present disclosure.
Figure 9:
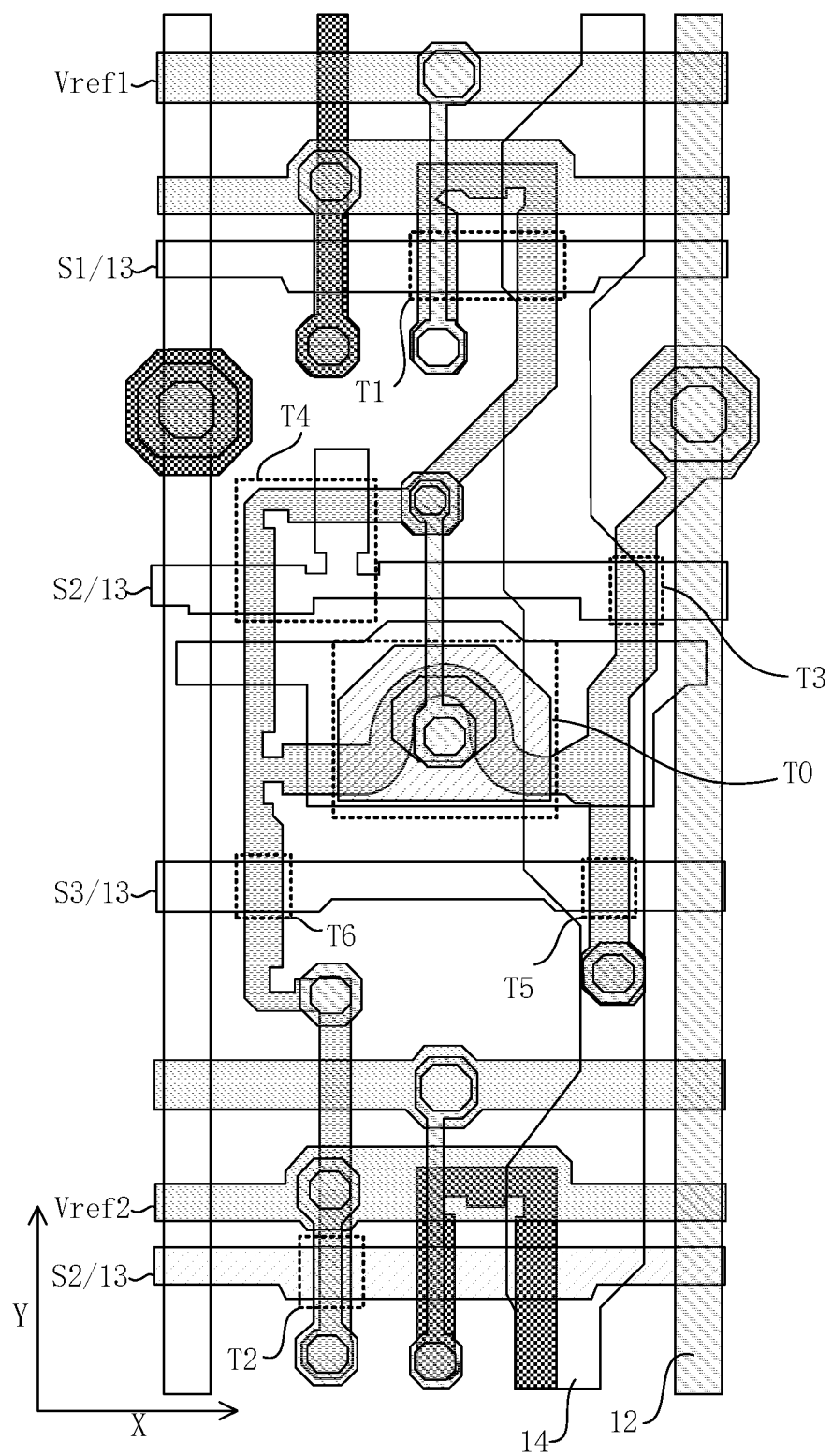
FIG. 9 is a schematic diagram showing a layout of a pixel circuit according to an embodiment of the present disclosure.
Figure 10:
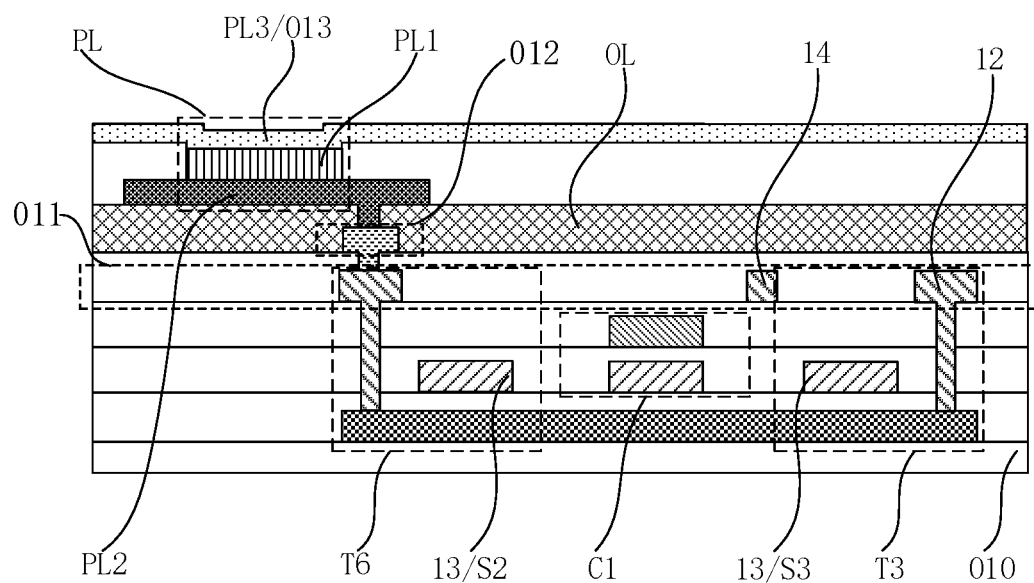
FIG. 10 is a cross-sectional view of a display region according to an embodiment of the present disclosure.
Figure 11:
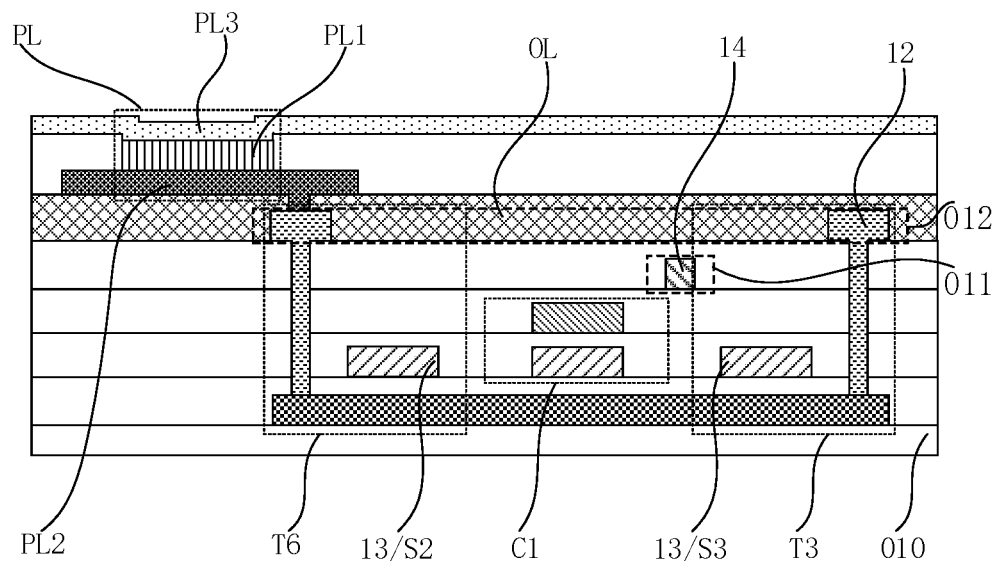
FIG. 11 is a cross-sectional view of a display region according to another embodiment of the present disclosure.

FIG. 8 is an equivalent circuit diagram of a light-emitting pixel according to an embodiment of the present disclosure, FIG. 9 is a schematic diagram showing a layout of a pixel circuit according to an embodiment of the present disclosure, FIG. 10 is a cross-sectional view of a display region according to an embodiment of the present disclosure, and FIG. 11 is a cross-sectional view of a display region according to another embodiment of the present disclosure.

As shown in FIG. 1 and FIG. 2, the display region AA includes light-emitting pixels 11 for light-emitting display. As shown in FIG. 8 and FIG. 11, the light-emitting pixel 11 includes a pixel circuit PD and a light-emitting device PL.

The light-emitting device PL includes a light-emitting material layer PL1, an anode PL2 and a cathode PL3. An output terminal of the pixel circuit PD is connected to one of the anode PL2 and the cathode PL3 of the light-emitting device PL, while the other of the anode PL2 and the cathode PL3 of the light-emitting device PL receives a power voltage. In a light-emitting process of the light-emitting device PL, the pixel circuit PD further needs to receive a power voltage to generate a light-emitting driving current.

For example, as shown in FIG. 1 and FIG. 8, the output terminal of the pixel circuit PD is connected to the anode PL2 of the light-emitting device PL, and the cathode PL3 of the light-emitting device PL directly receives a power voltage. The output terminal of the pixel circuit PD can also be connected to the cathode PL3 of the light-emitting device PL, and the anode PL2 of the light-emitting device PL directly receives a power voltage. The power voltage received by the pixel circuit PD has different potential from the power voltage received by the anode PL2 or the cathode PL3 of the light-emitting device PL.

Referring to FIG. 8 and FIG. 9, the pixel circuit PD can include a light-emitting driving transistor T0, a first reset transistor T1, a second reset transistor T2, a data voltage writing transistor T3, a threshold grabbing transistor T4, a power voltage writing transistor T5, a light-emitting control transistor T6 and a storage capacitor C1.

The display region AA further includes data lines 12, scan lines 13 and first signal lines 14.

The storage capacitor C1 includes one electrode plate electrically connected to a gate electrode of the light-emitting driving transistor T0, and the other electrode plate electrically connected to an input terminal of the power voltage writing transistor T5.

The first reset transistor T1 includes an input terminal electrically connected to a first reset signal line Vref1, an output terminal electrically connected to a gate electrode of the light-emitting driving transistor T0, and a control terminal electrically connected to the first scan line S1. The first reset transistor T1 is configured to reset the gate electrode of the light-emitting driving transistor T0.

The second reset transistor T2 includes an input terminal connected to a second reset signal line Vref2, an output terminal electrically connected to a light-emitting device PL, and a control terminal electrically connected to the second scan line S2. The second reset transistor T2 is configured to reset the anode or cathode of the light-emitting device PL. The signals of the first reset signal line vref1 and the second reset signal line vref2 can be the same or different.

The data voltage writing transistor T3 includes an input terminal connected to the data line 12, an output terminal electrically connected to the input terminal of the light-emitting driving transistor T0, and a control terminal electrically connected to the second scan line S2. The threshold grabbing transistor T4 includes an input terminal electrically connected to the light-emitting driving transistor T0, an output terminal electrically connected to the gate electrode of the light-emitting driving transistor T0, and a control terminal electrically connected to the second scan line S2. The data voltage writing transistor T3 cooperates with the threshold grabbing transistor T4 to write a data voltage Vdata into the gate electrode of the light-emitting driving transistor T0.

The power voltage writing transistor T5 includes an input terminal connected to the first signal line 14, an output terminal electrically connected to the input terminal of the light-emitting driving transistor T0, and a control terminal electrically connected to the third scanning line S3, and is configured to write the first power voltage into the input terminal of the light-emitting driving transistor T0.

The light-emitting control transistor T6 includes an input terminal electrically connected to the output terminal of the light-emitting driving transistor T0, an output terminal electrically connected to the light-emitting device PL, and a control terminal electrically connected to the third scan line. The light-emitting control transistor T6 is configured to transmit a light-emitting driving current generated by the light-emitting driving transistor T0 to the light-emitting device PL.

FIG. 8 and FIG. 9 only schematically show a structure of the pixel circuit, which can be other structures than those shown in FIG. 8 and FIG. 9.

The power voltage received by the anode PL2 or cathode PL3 of the light-emitting device PL has different potential from the power voltage received by the pixel circuit PD. The power voltage received by the pixel circuit PD is defined as a first power voltage. The power voltage received by the anode PL2 or cathode PL3 of the light-emitting device PL is defined as a second power voltage. The anode PL2 or cathode PL3 that receives the second power voltage in the light-emitting device PL is defined as a first electrode. A signal line for transmitting the first power voltage to the pixel circuit PD in the display region AA is defined as a first signal line 14. That is, the first signal line 14 transmits the first power voltage.

The first conductive block 21 transmits the first power voltage to the first signal line 14, and the second conductive block transmits the second power voltage to the first electrode.

The non-display region NA further includes a first power line 23 and a second power line 24. The first power line 23 can be understood as a portion of the first signal line 14 extending from the display region AA into the non-display region NA. The second power line 24 can be understood as a portion of the first electrode extending from the display region AA into the non-display region NA. The first electrodes in the light-emitting devices PL are connected to form a whole-surface conductive structure. The portion of the whole-surface conductive structure extending into the non-display region and electrically connecting to the second conductive block 22 is the second power line 24.

The first conductive block 21 is electrically connected to the first power line 23 and is configured to transmit the first power voltage to the first power line 23. The second conductive block 22 is electrically connected to the second power line 24 and is configured to transmit the second power voltage to the second power line 24. That is, the first conductive block 21 is electrically connected to the first signal line 14 through the first power line 23, and the second conductive block 22 is electrically connected to the first electrode through the second power line 24.

In an embodiment of the present disclosure, referring to FIG. 1 and FIG. 2, the first region NA1 is further provided with binding pins 25 and fan-shaped traces 26, etc., so that the first region NA1 constitutes the lower border region of the display region AA.

Referring to FIG. 1, FIG. 2, and FIG. 9, the first direction Y can be the same as the extending directions of the data lines 12 and the first signal lines 14. That is, the arrangement of the first region NA1 and the display region AA is consistent with the extending directions of the data lines 12 and the first signal lines 14. For example, as shown in FIG. 1, the first direction Y can be the column direction shown in FIG. 1. At this time, the data lines 12 and the first signal lines 14 extend along the column direction, and the first region NA1 and the display region AA are arranged along the column direction.

In some embodiments of the present disclosure, as shown in FIG. 3, FIG. 4, and FIG. 5, an overlapping region is formed between the fourth portion 222 and the first portion 211 along the thickness direction of the display panel 01. That is to say, the second conductive block 22 at least partially overlaps with the first conductive block 21 in different conductive layers, so that the conductivity of the first conductive block 21 and the conductivity of the second conductive block 22 can be reasonably regulated, under the premise that the first conductive block 21 and the second conductive block 22 in the first region NA1 will not occupy excessive large area.

As described above, to ensure the conductivity of the first conductive block 21 and the conductivity of the second conductive block 22, the first conductive block 21 and the second conductive block 22 each can be designed as a structure including multiple portions located in different conductive layers. However, the traces in the first region NA1 are diverse and complex, and structures that are included in the first conductive block 21 and the second conductive block 22 and located in different layers have limited areas. In addition, to achieve narrow borders, the first conductive block 21 and the second conductive block 22 in the first region NA1 are required to compress their widths along the first direction Y.

In some embodiments of the present disclosure, the fourth portion 222 of the second conductive block 22 located in the second conductive layer 012 overlaps with the first portion 211 of the first conductive block 21 located in the first conductive layer 011, so that the conductivity of the first conductive block 21 and the conductivity of the second conductive block 22 can be reasonably regulated in a limited space.

Along the second direction X, the second conductive block 22 is located outside the first conductive block 21. When the display panel is designed to reduce the border, an area compression degree of the second conductive block 22 is greater than an area compression degree of the first conductive block 21 in the first region NA1. By extending the fourth portion 222 of the second conductive block 22 located in the second conductive layer 012 to the first portion 211 of the first conductive block 21 located in the first conductive layer 011, the resistance of the second conductive block 22 can be effectively reduced, and display effect of the display panel can be improved.

The first conductive block 21 is mainly provided in the first region NA1 and is electrically connected to the first power line 23 in the first region NA1, so that the compressed area of the first conductive block 21 has little influence on the signal transmitted by the first conductive block 21. However, the second conductive block 22 needs to extend beyond the first region NA1 to be electrically connected to the second power line 24. If the excessively compressed area of the second conductive block 22 greatly affects the transmitted signal, for example, during the transmission of instantaneous high current of aging test and the high current of the high-brightness test required by the customer, there is a burn risk of the second conductive block. Since the second conductive block is electrically connected to the pixel circuit PD in the display region AA, it may adversely affect display effect of the display panel. By extending the fourth portion 222 of the second conductive block 22 to the region where the first portion 211 of the first conductive block 21 in the first conductive layer 011 is located, the area of the second conductive block 22 can be prevented from being excessively small, thereby increasing the conductivity of the second conductive block 22, reducing the impedance of the second conductive block 22, and thus improving the yield of the display panel.

As shown in FIG. 4, FIG. 5, FIG. 10, and FIG. 11, the first portion 211 of the first conductive block 21 and the third portion 221 of the second conductive block 22 can be provided in a same layer as the first signal line 14. That is, the first signal line 14, the first portion 211 of the first conductive block 21, and the third portion 221 of the second conductive block 22 are located in the first conductive layer 011.

As shown in FIG. 4, FIG. 5, FIG. 10, and FIG. 11, the second portion 212 of the first conductive block 21 and the fourth portion 222 of the second conductive block 22 can be provided in a different layer from the first signal line 14. For example, the second portion 212 of the first conductive block 21 and the fourth portion 222 of the second conductive block 22 can be provided at a side of the first conductive layer 011 away from the substrate 010. In an embodiment of the present disclosure, the second portion 212 or the fourth portion 222 can also be provided at a side of the first conductive film 011 close to the substrate 010.

In an embodiment of the present disclosure, as shown in FIG. 10, the data line 12 and the first signal line 14 can be provided in a same layer, so that the first portion 211 of the first conductive block 21 and the third portion 221 of the second conductive block 22 can be provided in a same layer as the data line 12.

In another embodiment, as shown in FIG. 11, the data line 12 can be provided in a different layer from the first signal line 14, so that the first portion 211 of the first conductive block 21 and the third portion 221 of the second conductive block 22 can be provided in a same layer as the first signal line 14 and located in the first conductive layer 011. The second portion 212 of the first conductive block 21 and the fourth portion 222 of the second conductive block 22 can be provided in a same layer as the data line 12 and located in the second conductive layer 012.

In an embodiment of the present disclosure, along a direction perpendicular to the plane of the substrate, the second conductive layer 012 can also be a conductive layer located between the data line 12 and the first conductive layer 011 in the display panel. In an embodiment of the present disclosure, in the display panel including the oxide semiconductor transistor, the second conductive layer 012 can also be in a same layer as the gate electrode of the oxide semiconductor transistor.

Figure 12:
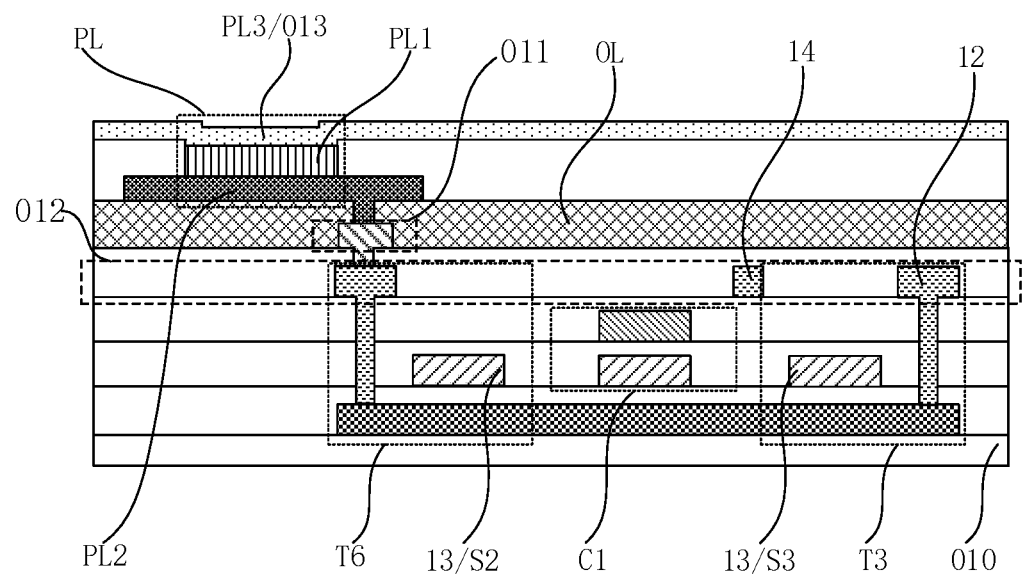
FIG. 12 is a cross-sectional view of a display region according to another embodiment of the present disclosure.
Figure 13:
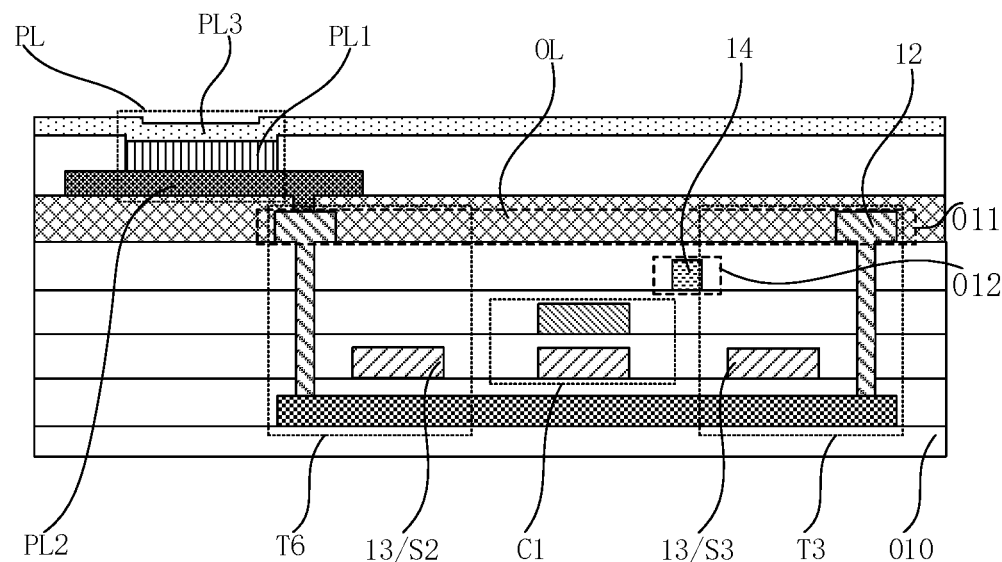
FIG. 13 is a cross-sectional view of a display region according to another embodiment of the present disclosure.

FIG. 12 is a cross-sectional view of a display region according to another embodiment of the present disclosure, and FIG. 13 is a cross-sectional view of a display region according to another embodiment of the present disclosure.

Referring to FIG. 6, FIG. 7, FIG. 12, and FIG. 13, the second portion 212 of the first conductive block 21 and the fourth portion 222 of the second conductive block 22 can be provided in a same layer as the first signal line 14. That is, the first signal line 14, the second portion 212 of the first conductive block 21, and the fourth portion 222 of the second conductive block 22 are located in the second conductive layer 012.

Referring to FIG. 6, FIG. 7, FIG. 12, and FIG. 13, the first portion 211 of the first conductive block 21 and the third portion 221 of the second conductive block 22 can be provided in a different layer from the first signal line 14. For example, the first portion 211 of the first conductive block 21 and the third portion 221 of the second conductive block 22 are provided at a side of the second conductive layer 012 away from the substrate 010.

In an embodiment of the present disclosure, as shown in FIG. 12, the data line 12 and the first signal line 14 can be provided in a same layer, so that the second portion 212 of the first conductive block 21 and the fourth portion 222 of the second conductive block 22 can be provided in a same layer as the data line 12.

In another embodiment, as shown in FIG. 13, the data line 12 can be provided in a different layer from the first signal line 14, so that the second portion 212 of the first conductive block 21 and the fourth portion 222 of the second conductive block 22 can be provided in a same layer as the first signal line 14 and located in the second conductive layer 012. The first portion 211 of the first conductive block 21 and the third portion 221 of the second conductive block 22 can be provided in a same layer as the data line 12 and located in the first conductive layer 011.

As shown in FIG. 3, the first conductive block 21 is electrically connected to the first power line 23 in the first region NA1. Multiple first power lines 23 are distributed in the first region NA1 close to the display region AA along the second direction X. The second direction X is consistent with the extending direction of a boundary line between the display region AA and the first region NA1. As shown in FIG. 1 and FIG. 2, the second direction X can intersect with the first direction Y, and the second direction X can be perpendicular to the first direction Y.

In an embodiment of the present disclosure, referring to FIG. 1, FIG. 2, and FIG. 3, the first portion 211 of the first conductive block 21 includes a first connecting portion 2110 close to the display region AA. The first connecting portion 2110 extends along the second direction X and is electrically connected to the first power line 23. That is to say, the first connecting portion 2110 is a portion in which the first conductive block 21 is connected to the first power line 23. The first power line 23 can be provided in a same layer as the first connecting portion 2110.

The third portion 221 that is located in a same conductive layer as the first portion 211 is located at a side of the first connecting portion 2110 away from the display region AA. As shown in FIG. 1 to FIG. 3, along the first direction Y, the third portion 221 is located at a side of the connecting portion 2110 away from the display region AA. In the thickness direction of the display panel 01, the first connecting portion 2110 overlaps with the second portion 212, and the first connecting portion 2110 overlaps with the fourth portion 222. That is to say, in the first region NA1, an overlapping region between the fourth portion 222 of the second conductive block 22 and the first portion 211 of the first conductive block 21 includes a portion between a region where the third portion 221 of the first connecting portion 2110 is located and a region where the display region AA is located. For example, as shown in FIGS. 1 and 2, the fourth portion 222 of the second conductive block 22 extends from a region where the third portion 221 is located to the display region AA and at least partially overlaps with the first connecting portion 2110.

By extending the fourth portion 222 of the second conductive block 22 located in the second conductive layer to the first connecting portion 2110 of the first conductive block 21 located in the first conductive layer and close to the display region AA, the area of the fourth part 222 is increased, so that the conductivity of the second conductive block 22 is further increased without additionally increasing the width of the first region NA1 in the display panel 01 along the first direction Y, thereby achieving a narrow border. Although the fourth portion 222 overlaps with the first connecting portion 2110, it does not affect the width and area of the first connecting portion 2110. The electrical connection between the second conductive block 22 and the first power line 23 is achieved in the first region NA1, and the first connecting portion 2110 is directly connected to the first power line 23 in the second conductive block 22, so that in this design, there will be little to no influence to the signals provided by the second conductive block 22 for the first power line 23 and the first signal line 14.

Figure 14:
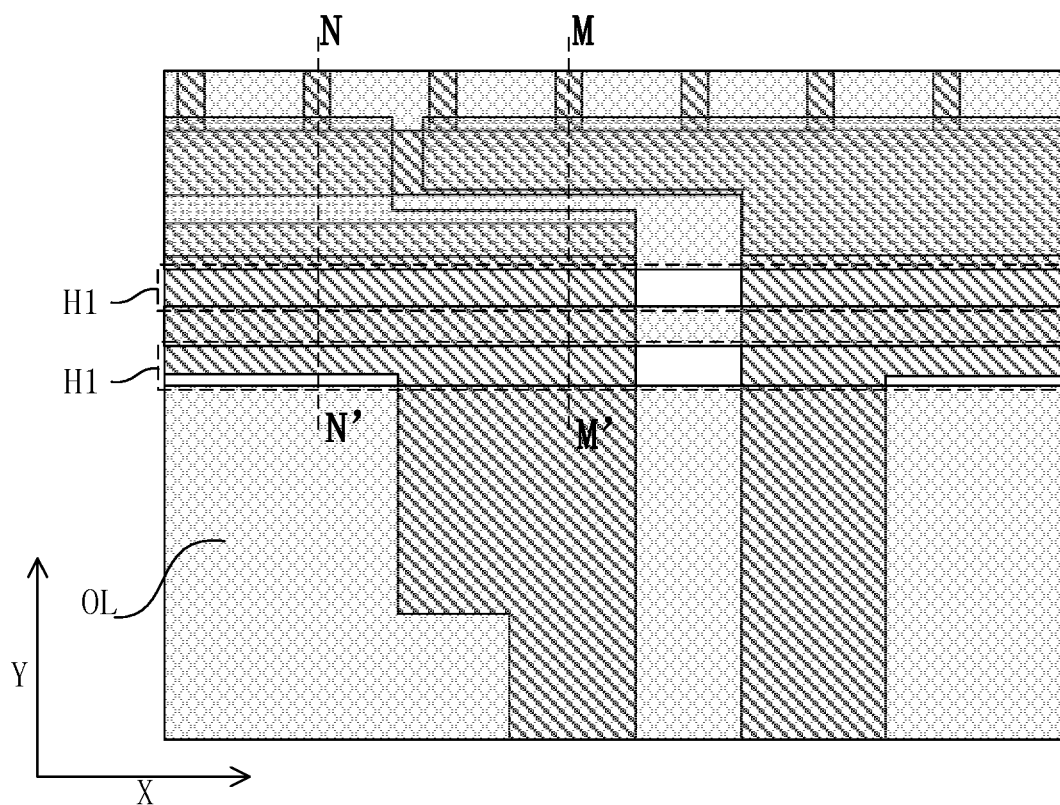
FIG. 14 is a partial enlarged view of a first region shown in FIG. 1 and FIG. 2 according to an embodiment of the present disclosure.
Figure 15:
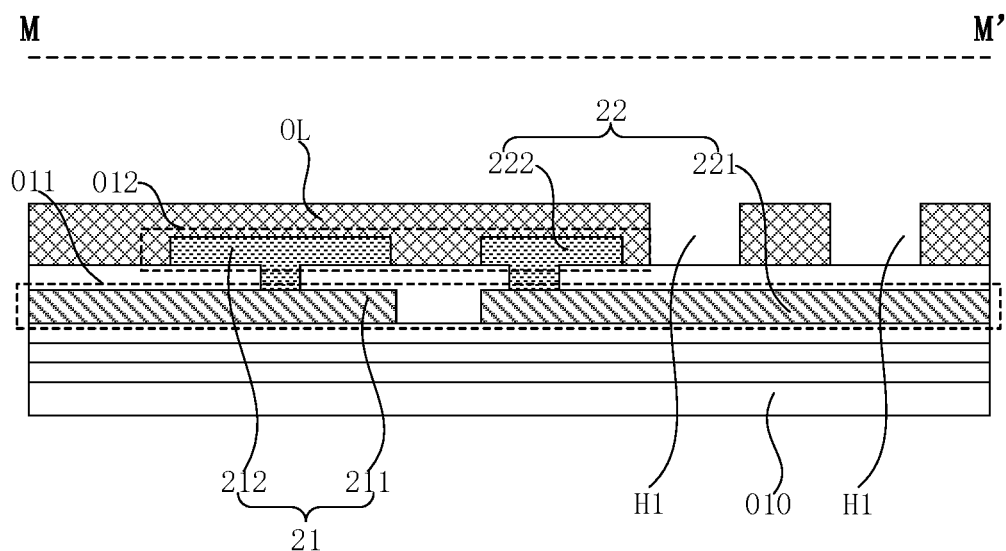
FIG. 15 is a cross-sectional view along an MM' direction shown in FIG. 14 according to an embodiment of the present disclosure.
Figure 16:
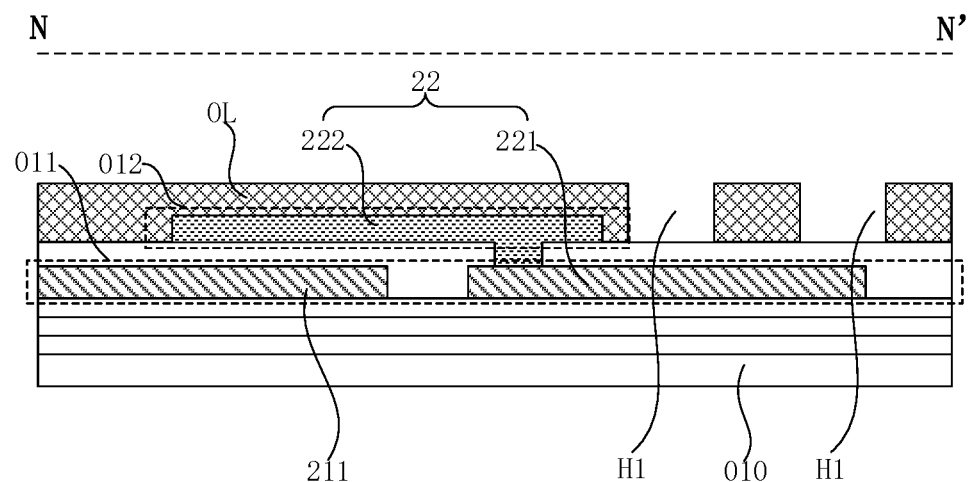
FIG. 16 is a cross-sectional view along an NN' direction shown in FIG. 14 according to an embodiment of the present disclosure.

FIG. 14 is a partial enlarged view of a first region shown in FIG. 1 and FIG. 2 according to an embodiment of the present disclosure, FIG. 15 is a cross-sectional view along an MM' direction shown in FIG. 14 according to an embodiment of the present disclosure, and FIG. 16 is a cross-sectional view along an NN' direction shown in FIG. 14 according to an embodiment of the present disclosure.

In an embodiment of the present disclosure, referring to FIG. 14, FIG. 15, and FIG. 16, the display panel 01 further includes a substrate 010 and a first organic layer OL. A first conductive layer 011 is provided between the substrate 010 and the second conductive layer 012. The second conductive layer 012 is provided between the first organic layer OL and the first conductive layer 011. That is, the substrate 010, the first conductive layer 011, the second conductive layer 012 and the first organic layer OL in the display panel are arranged in sequence. An insulating layer is provided between the first conductive layer 011 and the second conductive layer 012.

In the first region NA1, the conductive layer where the first portion 211 and the third portion 221 are located is provided between the conductive layer where the second portion 212 and the fourth portion 222 are located and the substrate 010, and the first organic layer OL is provided at a side of the conductive layer where the second portion 212 and the fourth portion 222 are located away from the substrate 010.

In the first region NA1, the first organic layer OL includes an opening region H1. The organic layer located in the non-display region NA1 is designed with an opening to form a dam structure to block water and oxygen outside the display panel 01 from permeating into the display panel 01 through the organic layer, thereby preventing the outside water, oxygen from eroding signal lines and devices in the display panel 01.

The second portion 212 and the fourth portion 222 in the second conductive layer 012 do not overlap with the opening region H1. In the first region NA1, the opening region H1 is provided in the first organic layer OL at a side of the second conductive layer 012 away from the substrate 010, and the second portion 212 and the fourth portion 222 in the second conductive layer 012 are designed to avoid at the opening region H1 of the first organic layer PL, thus preventing the second portion 212 and the fourth portion 222 in the second conductive layer 012 from being etched away in a subsequent etching process and affecting reliability of the second portion 212 and the fourth portion 22.

In an embodiment of the present disclosure, in the first region NA1, the first organic layer OL includes multiple opening regions H1. The second portion 212 and the fourth portion 222 in the second conductive layer extend in a direction away from the display region AA and terminate before the opening region H1 of the first organic layer OL closest to the display region AA, thus preventing the second portion 212 and the fourth portion 222 from being etched away in a subsequent etching process.

Figure 17:
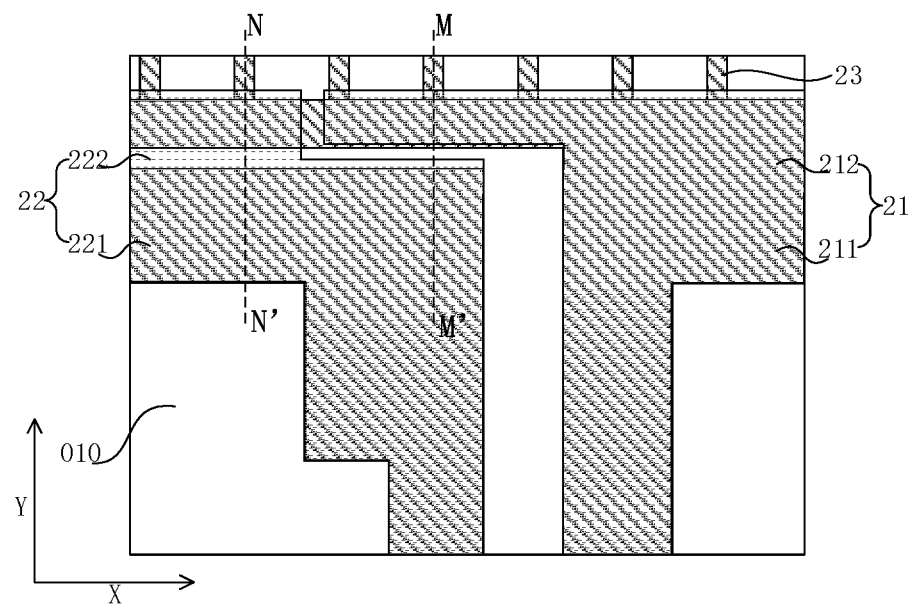
FIG. 17 is a partial enlarged view of a first region shown in FIG. 1 and FIG. 2 according to an embodiment of the present disclosure.
Figure 18:
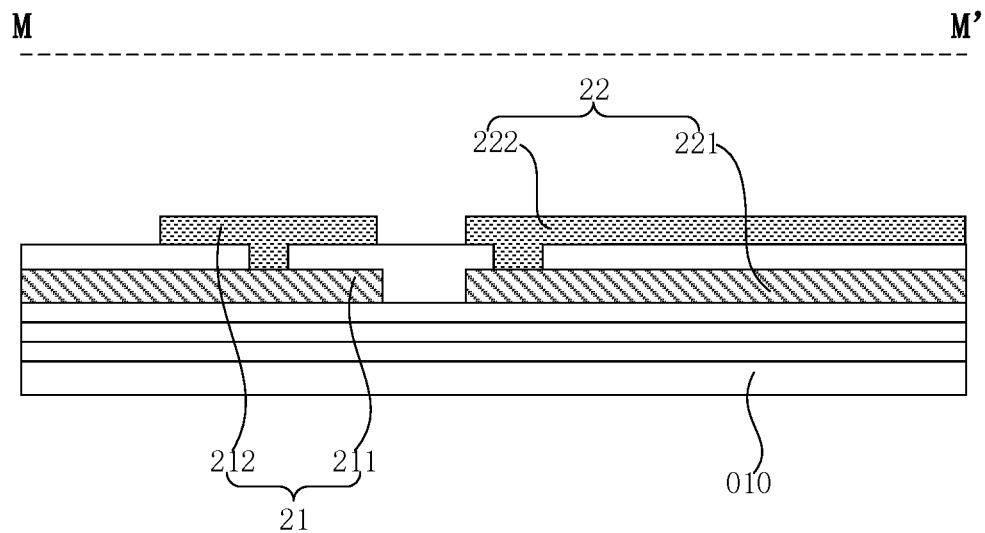
FIG. 18 is a cross-sectional view along an MM' direction shown in FIG. 17 according to an embodiment of the present disclosure.
Figure 19:
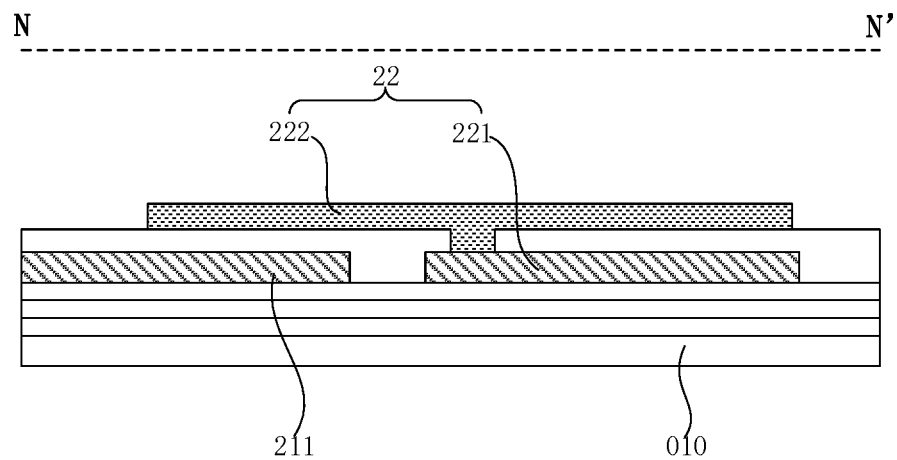
FIG. 19 is a cross-sectional view along an NN' direction shown in FIG. 17 according to an embodiment of the present disclosure.

FIG. 17 is a partial enlarged view of a first region shown in FIG. 1 and FIG. 2 according to an embodiment of the present disclosure, FIG. 18 is a cross-sectional view along an MM' direction shown in FIG. 17 according to an embodiment of the present disclosure, and FIG. 19 is a cross-sectional view along an NN' direction shown in FIG. 17 according to an embodiment of the present disclosure.

In an embodiment of the present disclosure, the display panel 01 further includes a substrate 010, and the first conductive layer 011 is provided between the second conductive layer 012 and the substrate 010. That is, the substrate 010, the first conductive layer 011 and the second conductive layer 012 in the display panel are arranged in sequence. An insulating layer is provided between the first conductive layer 011 and the second conductive layer 012. Therefore, in the first region NA1, the conductive layer where the first portion 211 and the third portion 221 are located is provided between the conductive layer where the second portion 212 and the fourth portion 222 are located and the substrate 010.

Along the thickness direction of the display panel 01, the fourth portion 222 completely covers the third portion 221, so that the conductivity of the second conductive block 22 can be further increased.

In an embodiment of the present disclosure, the display panel 01 can further include a first organic layer OL. A portion of the first organic layer OL that is located in the first region NA1 can also be provided with an opening region H1. The fourth portion 222 can overlap with the opening region H1.

Moreover, along the thickness direction of the display panel 01, the second portion 212 completely covers the first portion 211, so that the conductivity of the first conductive block 21 can be further increased. The display panel 01 can further include a first organic layer OL. A portion of the first organic layer OL that is located in the first region NA1 can also be provided with an opening region H1. The second portion 212 can overlap with the opening region H1.

Figure 20:
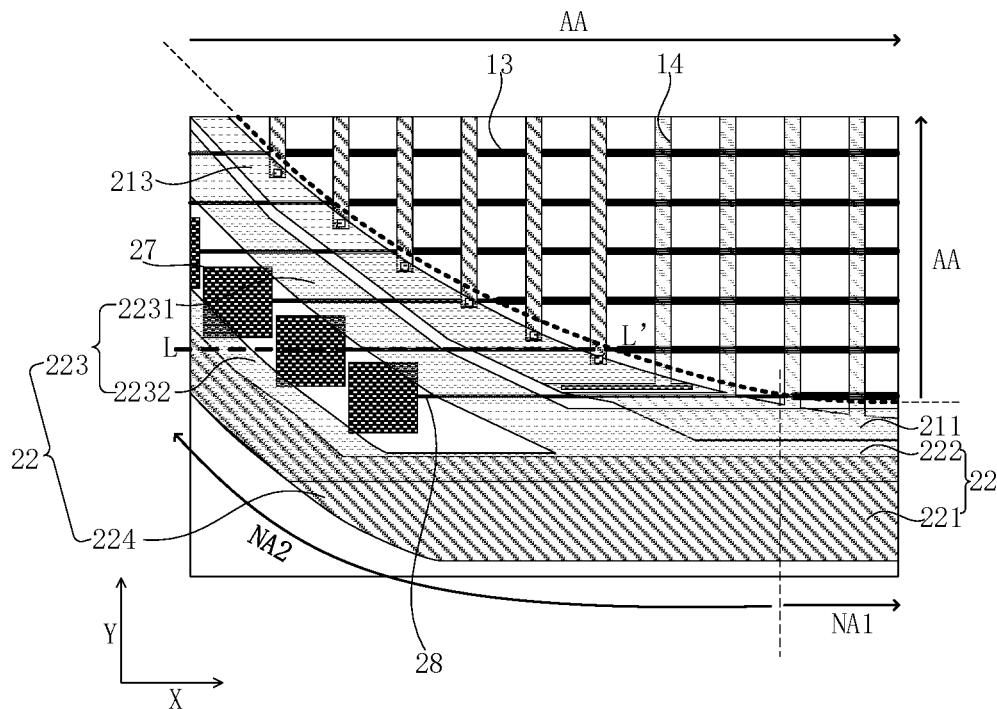
FIG. 20 is a partial enlarged view of FIG. 1 according to an embodiment of the present disclosure.

FIG. 20 is a partial enlarged view of FIG. 1 according to an embodiment of the present disclosure.

As shown in FIG. 20, the non-display region NA of the display panel includes a second region NA2 in addition to the first region NA1. The second region NA2 and the display region AA are arranged along a second direction X. A first direction Y intersects with the second direction X.

In an embodiment of the present disclosure, the non-display region NA of the display panel includes a chamfer region which can be included in the second region NA2. The second region NA2 can be connected to the first region NA1.

The scan line 13 can extend along the second direction X, so that along the extending direction of the scan lines 13, the non-display region NA outside all scan lines 13 is a second region NA2. Along the first direction Y, the first region NA1 is a region below the scan line 13 closest to the first region NA1, that is, the first region NA1 can have substantially the same width as the scan line 13 closest to first region NA1 along the second direction X.

In the second region NA2, the second conductive block 22 includes a fifth portion 223. The fifth portion 223 is located in one of the first conductive layer 011 and the second conductive layer 12. That is, the fifth portion 223 of the second conductive block 22 located in the second region NA2 is located in a same conductive layer as the third portion 221 of the second conductive block 22 located in the first region NA1. In an embodiment of the present disclosure, the fifth portion 223 of the second conductive block 22 located in the second region NA2 is located in a same conductive layer as the fourth portion 222 of the second conductive block 22 located in the first region NA1. Hereinafter, the fifth portion 223 and the fourth portion 222 being located in a same conductive layer is taken as an example.

As shown in FIG. 20, the fifth portion 223 includes a first sub-portion 2231 and a second sub-portion 2232. Along the second direction X, a distance between the first sub-portion 2231 and the second sub-portion 2232 is greater than 0. It can be understood that, since the first sub-portion 2231 and the second sub-portion 2232 belong to the fifth portion 223 of the second conductive block 22, the first sub-portion 2231 is electrically connected to the second sub-portion 2232.

In an embodiment of the present disclosure, the fifth portion 223 of the second conductive block 22 in the second region NA2 includes a structure including the first sub-portion 2231 and the second sub-portion 2232, so that an area of the fifth portion 223 is increased in the non-display region NA with a limited space.

Figure 21:
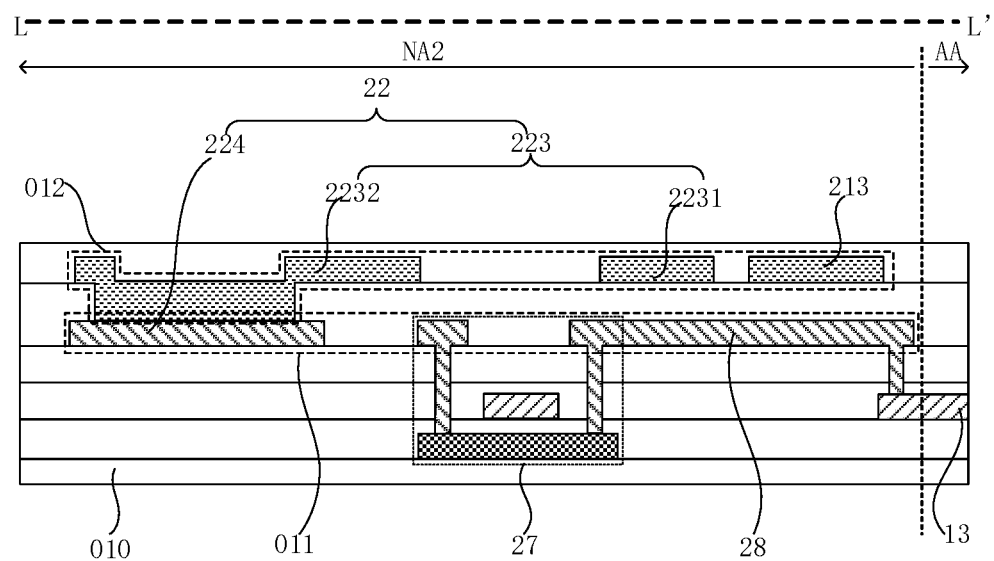
FIG. 21 is a partial cross-sectional view along an LL' direction shown in FIG. 20 according to an embodiment of the present disclosure.
Figure 22:
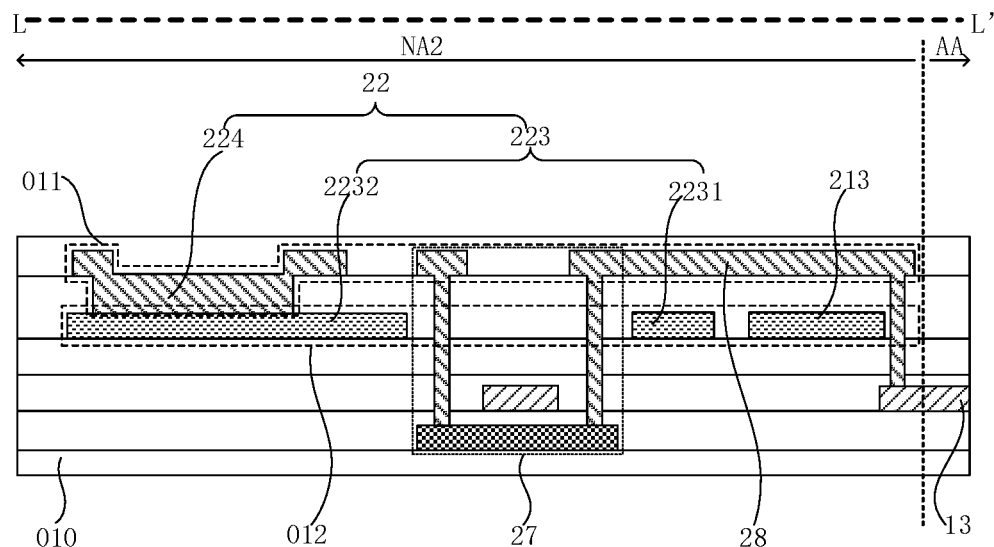
FIG. 22 is a partial cross-sectional view along an LL' direction shown in FIG. 20 according to another embodiment of the present disclosure.

FIG. 21 is a partial cross-sectional view along an LL' direction shown in FIG. 20 according to an embodiment of the present disclosure, and FIG. 22 is a partial cross-sectional view along an LL' direction shown in FIG. 20 according to another embodiment of the present disclosure.

In an embodiment of the present disclosure, referring to FIGS. 20, 21, and 22, a driving circuit 27 is included in the second region NA2. A first sub-portion 2231 of the fifth portion 223 is located at a side of the driving circuit 27 close to the display region AA, and a second sub-portion 2232 is located at a side of the driving circuit 27 away from the display region AA. By adding the first sub-portion 2231 at a side of the driving circuit 27 close to the display region AA, the area of the second conductive block 22 in the second region NA2 can be increased, and the resistivity of the second conductive block 22 can be reduced.

Compared with the first region NA1, the second region NA2 can be a non-display region NA including the driving circuit 27. That is, the driving circuit 27 is provided in the second region NA2, but not provided in the first region NA1.

Since the wiring and circuits in the second region NA2 are compact and complex, the first sub-portion 2231 being located at a side of the driving circuit 27 close to the display region AA means that most of the region of the first sub-portion 2231 is located at a side of the driving circuit 27 close to the display region AA, and a small part of the region of the first sub-portion 2231 can overlap with the driving circuit 27. Here, the second sub-portion 2232 being located at a side of the driving circuit 27 away from the display region AA means that most of the region of the second sub-portion 2232 is located at a side of the driving circuit 27 away from the display region AA, and a small part of the region of the second sub-portion 2232 can overlap with the driving circuit 27.

The driving circuit 27 shown in FIG. 21 and FIG. 22 only illustrates one transistor, but the driving circuit 27 can further include other transistors and other types of devices, such as capacitors.

In an embodiment of the present disclosure, referring to FIG. 21 and FIG. 22, the display region includes a scan line 13. An output terminal of the driving circuit 27 is electrically connected to the scan line 13 through the first connecting line 28. That is, the driving circuit 27 can be a shift register that outputs a scan signal to the scan line 13.

The first connecting line 28 is located in one of the first conductive layer 011 and the second conductive layer 012, and the first connecting line 28 is provided in a different layer from the fifth portion 223 of the second conductive block 22. That is, when the fifth portion 223 is located in the first conductive layer 011, the first connecting line 28 is located in the second conductive layer 012. When the fifth portion 223 is located in the second conductive layer 012, the first connecting line 28 is located in the first conductive layer 011.

Since the first sub-portion 2231 of the fifth portion 223 is located at a side of the driving circuit 27 of the second region NA2 close to the display region AA, and the driving circuit 27 located in the second region NA2 is connected to the driving circuit 27 located in the display region AA by the first connecting line 28, the fifth portion 223 is provided in a different layer from the first connecting line 28, so that a short circuit between the fifth portion 223 and the first connecting line 28 can be avoided, thereby increasing the area of the second conductive block 22 in the second region NA2.

In the following description the fifth portion 223 being located in the second conductive layer 012 and the first connecting line 28 being located in the first conductive layer 011 is taken as an example.

In an embodiment of the present disclosure, as shown in FIG. 21, the conductive layer where the scan line 13 is located can be provided in a same layer as the gate electrode of the transistor, and the conductive layer where the scan line 13 is located is located at a side of the first conductive layer 011 and the second conductive layer 012 that are close to the substrate 010. The conductive layer where the first connecting line 28 is located is located at a side of the conductive layer where the fifth portion 223 is located, close to the substrate 010. That is, the conductive layer where the first connecting line 28 is located is located at a side of the conductive layer where the fifth portion 223 is located, close to the conductive layer where the scan line 13 is located.

In an embodiment of the present disclosure, referring to FIG. 20, FIG. 21 and FIG. 22, in the second region NA2, the second conductive block 22 further includes a sixth portion 224. The sixth portion 224 is located in a same conductive layer as the first connecting line 28, and is located at a side of the driving circuit 27 away from the display region AA. That is, the part of the second conductive block 22 located in the second region NA2 includes the fifth portion 223, and includes the sixth portion 224 provided in a different layer from the fifth portion 223. When the fifth portion 223 is located in the first conductive layer 011, the sixth portion 224 is located in the second conductive layer 012, and when the fifth portion 223 is located in the second conductive layer 012, the sixth portion 224 is located in the first conductive layer 011.

Although the sixth portion 224 is located in a same conductive layer as the first connecting line 28, the sixth portion 224 is located at a side of the driving circuit 27 away from the display region AA, so that the sixth portion 224 may not affect configuration of the first connecting line 28.

In an embodiment of the present disclosure, as shown in FIGS. 20-22, in the conductive layer where the fifth portion 223 is located, a first gap is formed between the first sub-portion 2231 and the second sub-portion 2232. That is, in the conductive layer where the fifth portion 223 is located, a portion located between the first sub-portion 2231 and the second sub-portion 2232 is a hollow portion.

In an embodiment of the present disclosure, the first gap formed between the first sub-portion 2231 and the second sub-portion 2232 at least partially overlaps with the driving circuit 27. That is, at least a part of the driving circuit is exposed from the hollow portion between the first sub-portion 2231 and the second sub-portion 2232 and in the conductive layer where the fifth portion 223 is located.

Under the requirement of the narrow border of the display panel, the width of the second region NA2 may also be compressed, so that a projection of at least part of the signal lines connected to the driving circuit 27 in the second region NA2 needs to overlap with the projection of the driving circuit 27. That is, these signal lines need to be arranged above the layer of the driving circuit 27. Since the fifth portion 223 is also located above the layer of the driving circuit 27, part of the signal lines connected to the driving circuit 27 can be provided in a same layer as the fifth portion 223 and located in the first gap. For example, a clock signal line electrically connected to the driving circuit 27 can have a double-layer trace configuration, and one of the traces can be provided in a same layer as the second portion 223 and located in the first gap.

Figure 23:
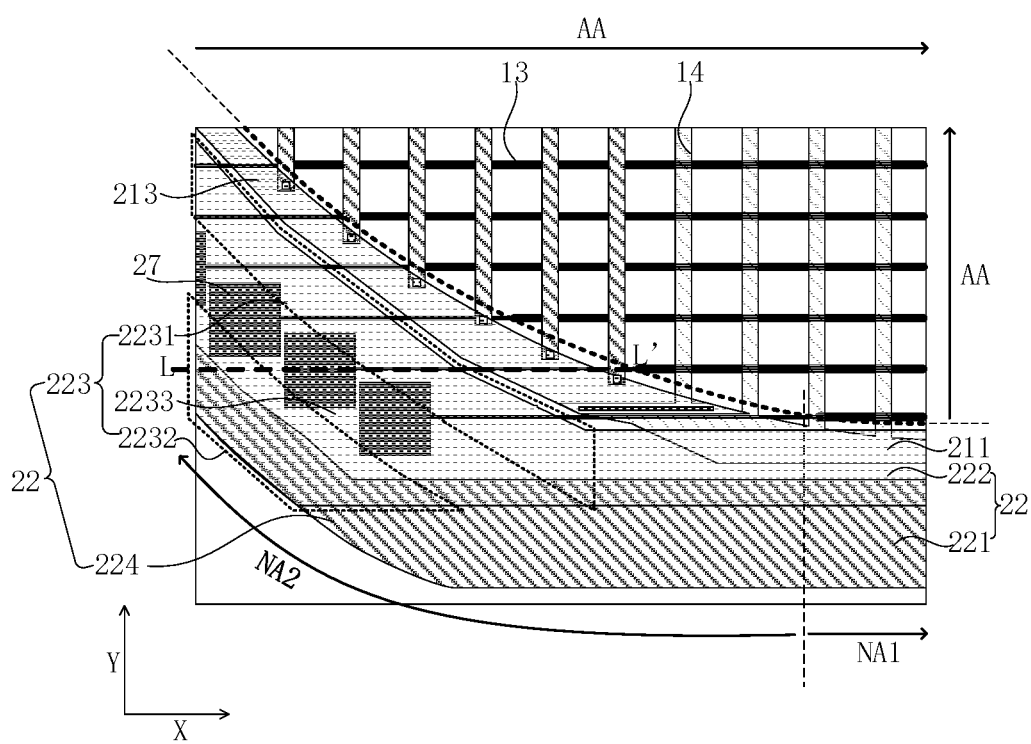
FIG. 23 is a partial enlarged view of FIG. 1 according to another embodiment of the present disclosure.
Figure 24:
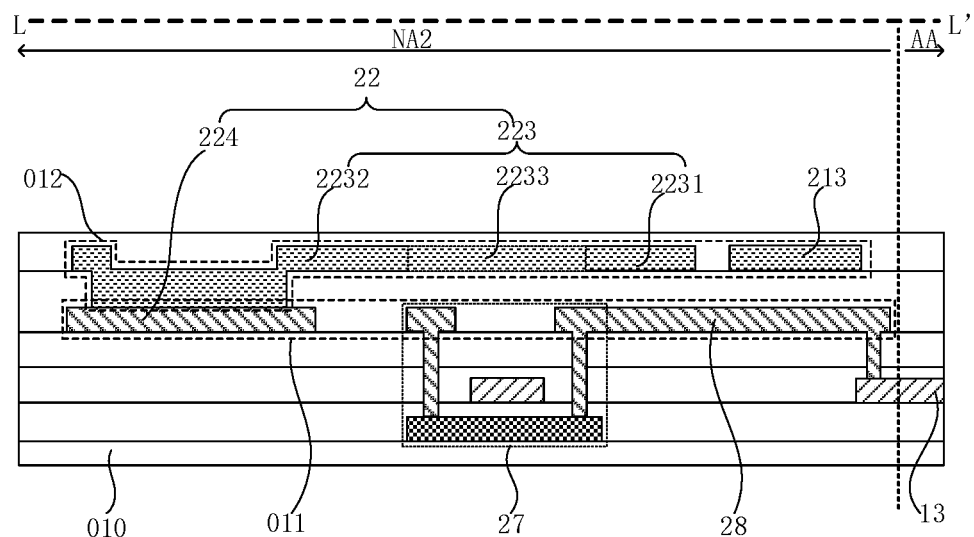
FIG. 24 is a partial cross-sectional view along an LL' direction shown in FIG. 23 according to an embodiment of the present disclosure.
Figure 25:
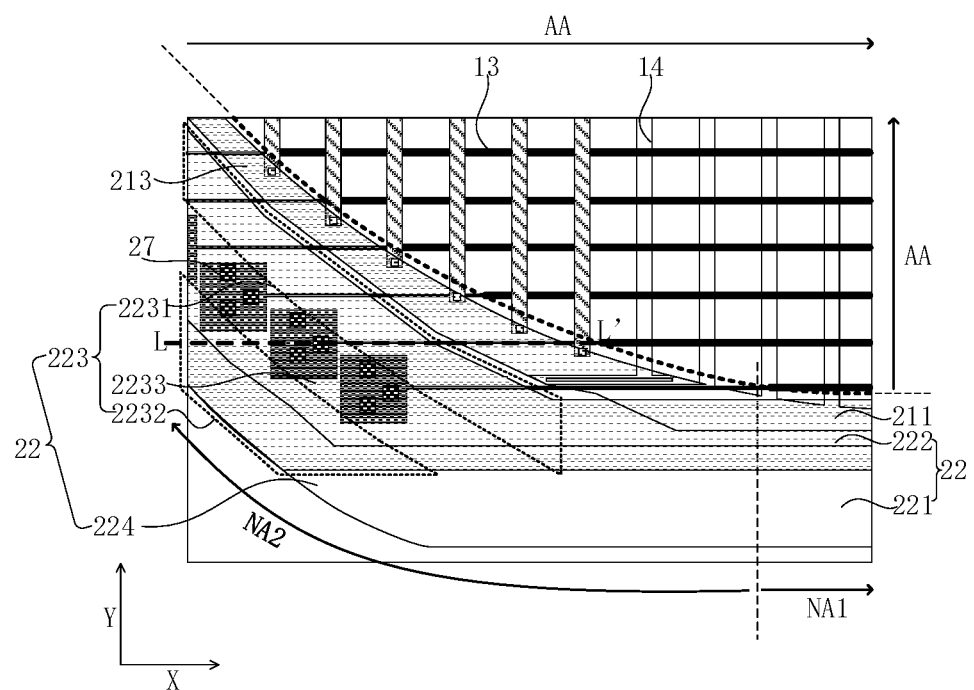
FIG. 25 is a partial enlarged view of FIG. 1 according to another embodiment of the present disclosure.
Figure 26:
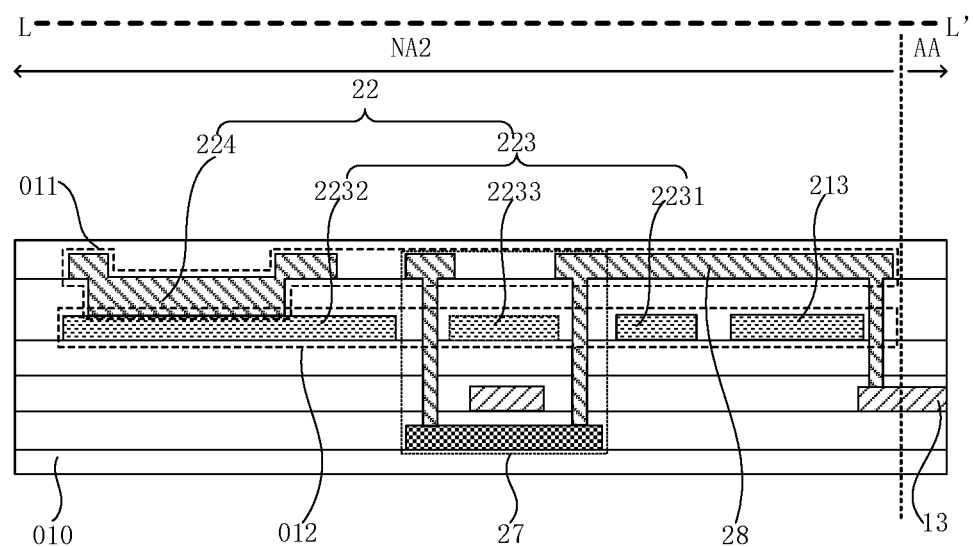
FIG. 26 is a partial cross-sectional view along an LL' direction shown in FIG. 25 according to an embodiment of the present disclosure.

FIG. 23 is a partial enlarged view of FIG. 1 according to another embodiment of the present disclosure, FIG. 24 is a partial cross-sectional view along an LL' direction shown in FIG. 23 according to an embodiment of the present disclosure, FIG. 25 is a partial enlarged view of FIG. 1 according to another embodiment of the present disclosure, and FIG. 26 is a partial cross-sectional view along an LL' direction shown in FIG. 25 according to an embodiment of the present disclosure.

In an embodiment of the present disclosure, referring to FIG. 23, FIG. 24, FIG. 25, and FIG. 26, the fifth portion 223 of the second conductive block 22 further includes a third sub-portion 2233. The third sub-portion 2233 is located in the first sub-portion 2231 and the second sub-portion 2232, and is connected to the first sub-portion 2231 and the second sub-portion connection 2232, respectively. That is, the fifth portion 23 located in the second region NA2 is a continuous structure along the second direction X, which includes the portions at both sides of the driving circuit 27 and the portion above the layer where the driving circuit 27 is located, so that the area of the second conductive block 22 can be effectively increased.

In an embodiment of the present disclosure, as shown in FIG. 23 and FIG. 24, when the second conductive layer 012 is located at a side of the first conductive layer 011 away from the substrate 010, all signal lines of the driving circuit 27 can be provided in the first conductive layer 011 and other conductive layers located in the first conductive layer 011 close to the substrate 010. At this time, the fifth portion 223 can completely cover the driving circuit 27 along the thickness direction of the display panel.

In an embodiment of the present disclosure, as shown in FIG. 25 and FIG. 26, when the second conductive layer 012 is located at a side of the first conductive layer 011 close to the substrate 010, at least part of the signal lines of the driving circuit 27 needs to be provided at a side of the second conductive layer 012 away from the substrate 010. At this time, an opening can be provided in the third sub-portion 2233 of the fifth portion 223, so that the driving circuit 27 is electrically connected to the signal line located above the second conductive layer 012. That is, the third sub-portion 2233 can be a grid-like structure.

Figure 27:
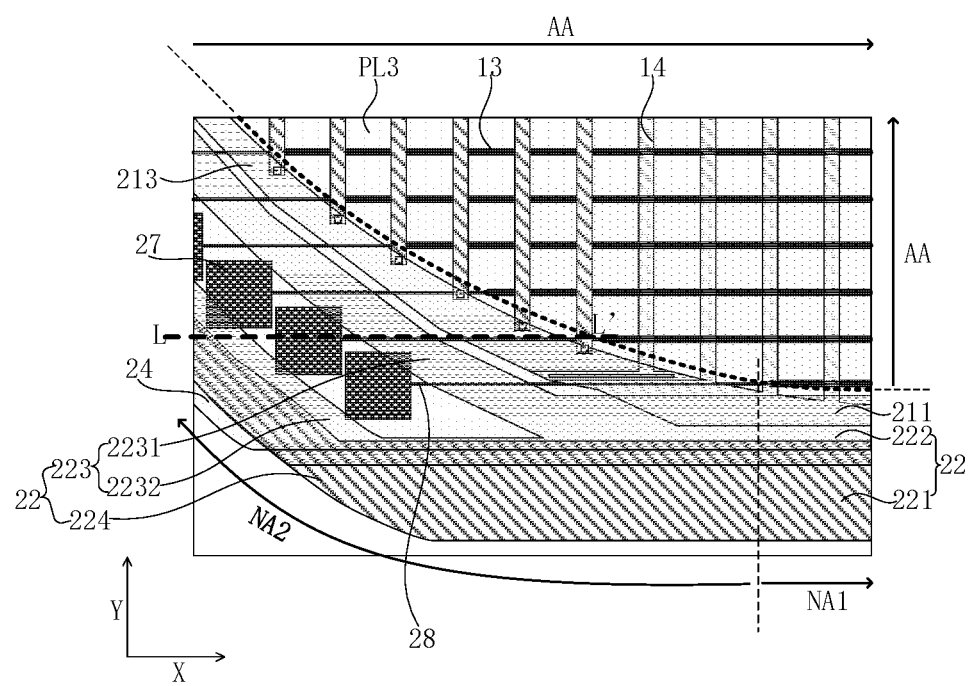
FIG. 27 is a partial enlarged view of FIG. 1 according to another embodiment of the present disclosure.
Figure 28:
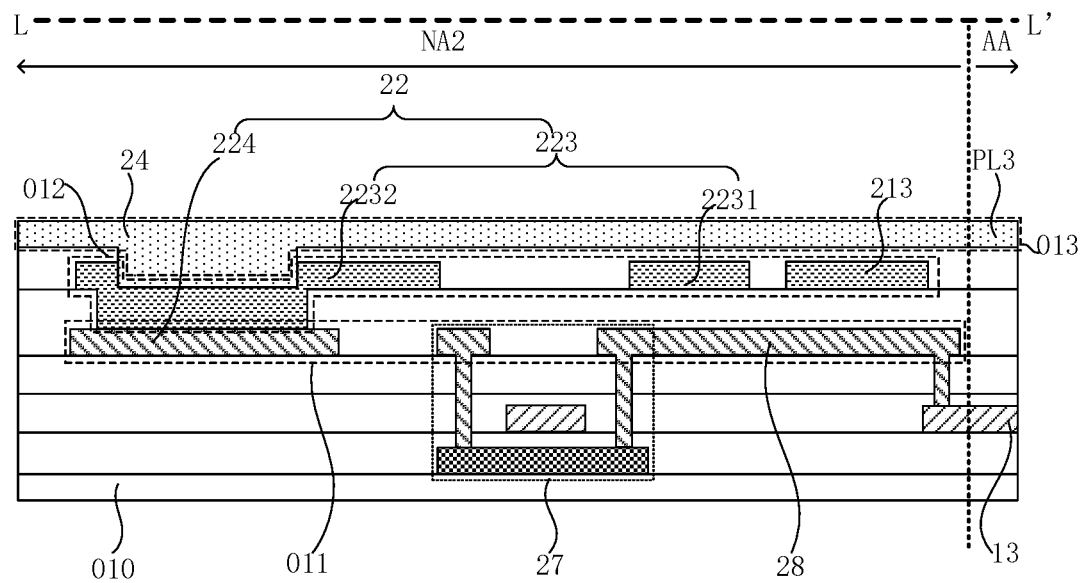
FIG. 28 is a partial cross-sectional view along an LL' direction shown in FIG. 27 according to an embodiment of the present disclosure.
Figure 29:
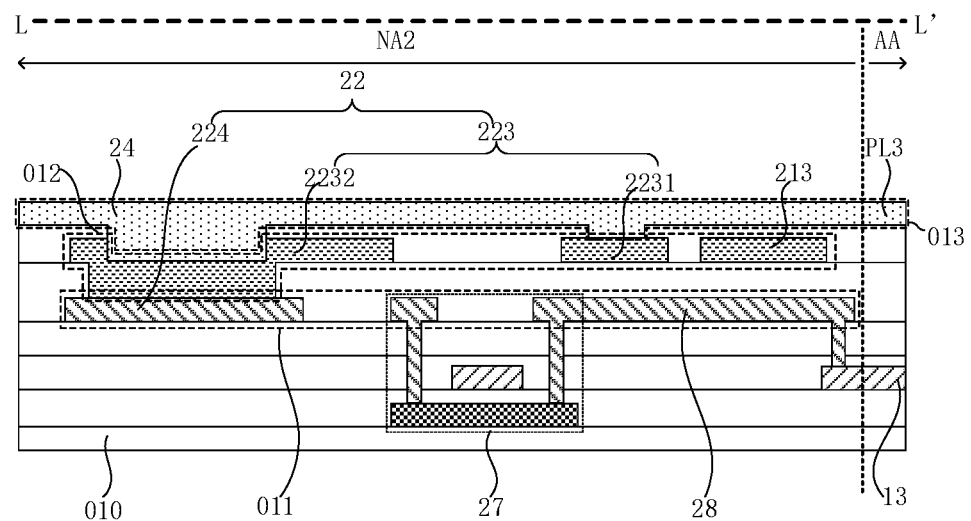
FIG. 29 is a partial cross-sectional view along an LL' direction shown in FIG. 27 according to another embodiment of the present disclosure.

FIG. 27 is a partial enlarged view of FIG. 1 according to another embodiment of the present disclosure, FIG. 28 is a partial cross-sectional view along an LL' direction shown in FIG. 27 according to an embodiment of the present disclosure, and FIG. 29 is a partial cross-sectional view along an LL' direction shown in FIG. 27 according to another embodiment of the present disclosure.

In an embodiment of the present disclosure, referring to FIG. 27, FIG. 28 and FIG. 29, the display region AA further includes a light-emitting device PL. The light-emitting device PL includes a first electrode located in the third conductive layer 013. The second region NA2 includes the second power line 24 located in the third conductive layer 013, and the second power line 2424 is electrically connected to the first electrode. As mentioned above, the second power line 24 can be regarded as the part of the third conductive layer 013 located in the second region NA2, and the first electrode is the anode or cathode of the light-emitting device PL, which is not elaborated herein. Hereinafter, the first electrode is used as the cathode of the light-emitting device PL for illustration.

In the second region NA2, the second power line 24 is electrically connected to the fifth portion 223 of the second conductive block 22. That is, the portion of the second conductive block 22 located in the second region NA2 is electrically connected to the first electrode through the second power line 24.

Since the fifth portion 223 includes the first sub-portion 2231 and the second sub-portion 2232 arranged along the second direction X, the electrical connection manner between the second power line 24 and the fifth portion 223 can be as follows. As shown in FIG. 28, the second power line 24 is connected to the second sub-portion 2232 of the fifth portion 223 through a via hole. In an embodiment of the present disclosure, as shown in FIG. 29, the second power line 22 can be connected to the second sub-portion 2232 of the fifth portion 223 through a via hole, and is connected to the first sub-portion 2231 of the fifth portion 223 through a via hole.

In the second region NA2, the configuration manners of the fifth portion 223 and the driving circuit 27 have been described in detail, which will not be elaborated herein. However, the connection manner of the second power line 24 and the second conductive block 22 in this embodiment is applicable to any of the above embodiments.

Figure 30:
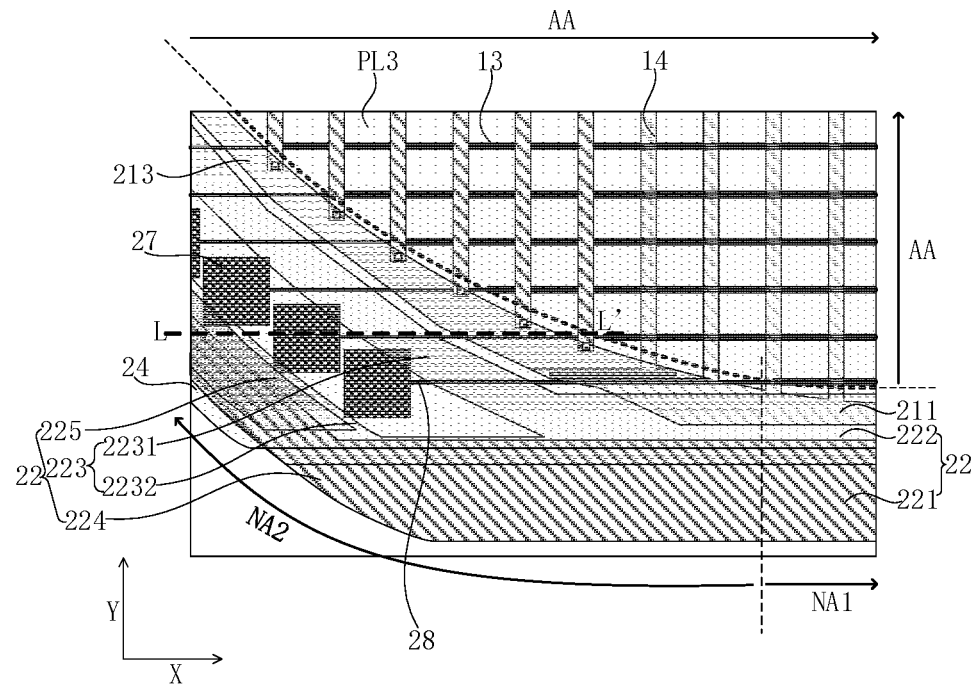
FIG. 30 is a partial enlarged view of FIG. 1 according to another embodiment of the present disclosure.
Figure 31:
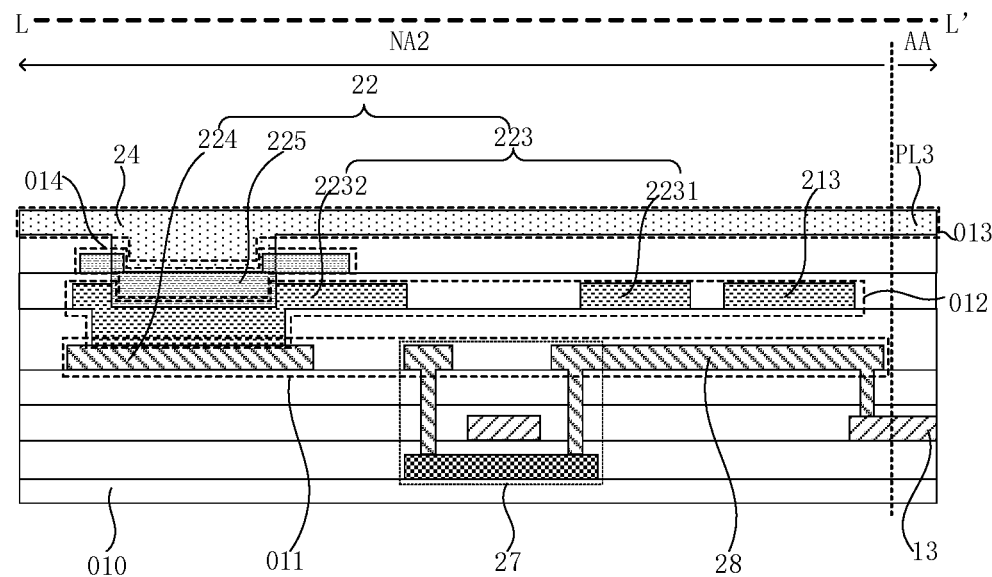
FIG. 31 is a partial cross-sectional view along an LL' direction shown in FIG. 30 according to an embodiment of the present disclosure.
Figure 32:
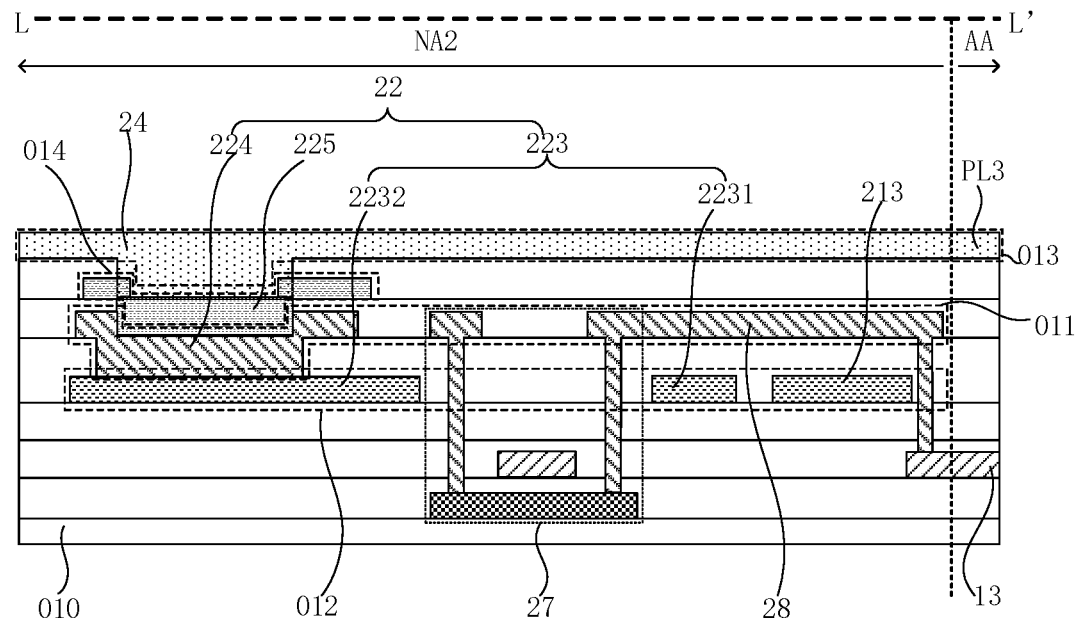
FIG. 32 is a partial cross-sectional view along an LL' direction shown in FIG. 30 according to another embodiment of the present disclosure.
Figure 33:
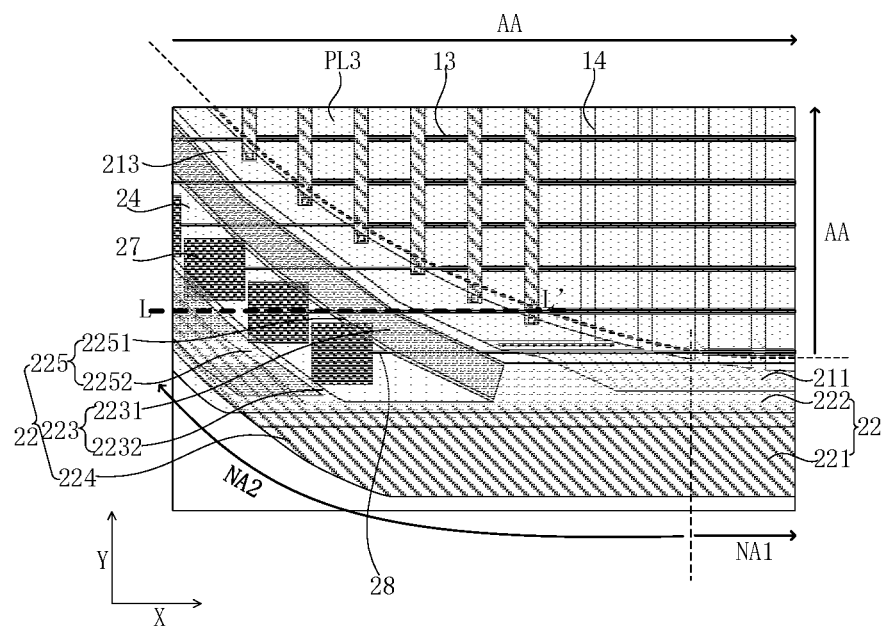
FIG. 33 is a partial enlarged view of FIG. 1 according to another embodiment of the present disclosure.
Figure 34:
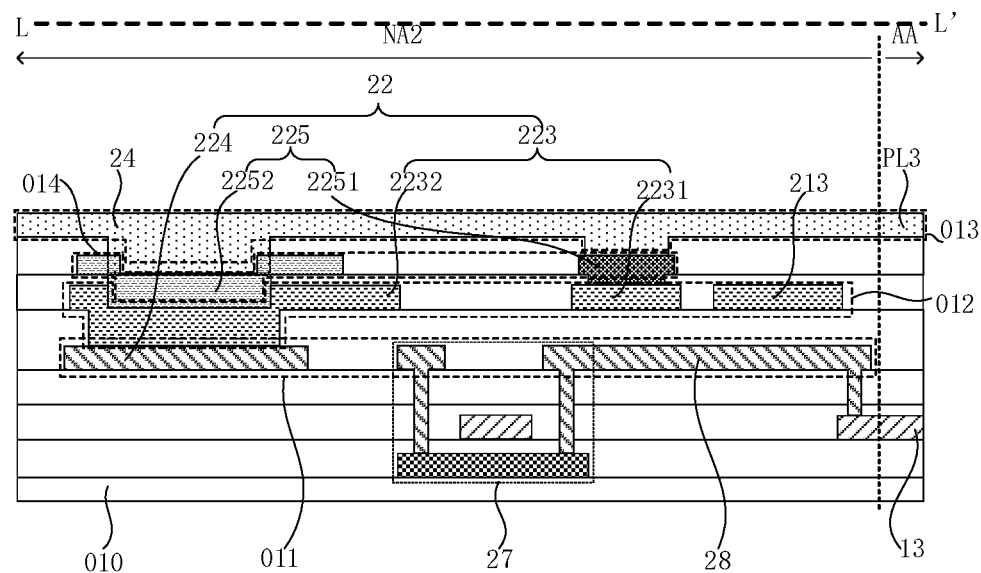
FIG. 34 is a partial cross-sectional view along an LL' direction shown in FIG. 33 according to an embodiment of the present disclosure.
Figure 35:
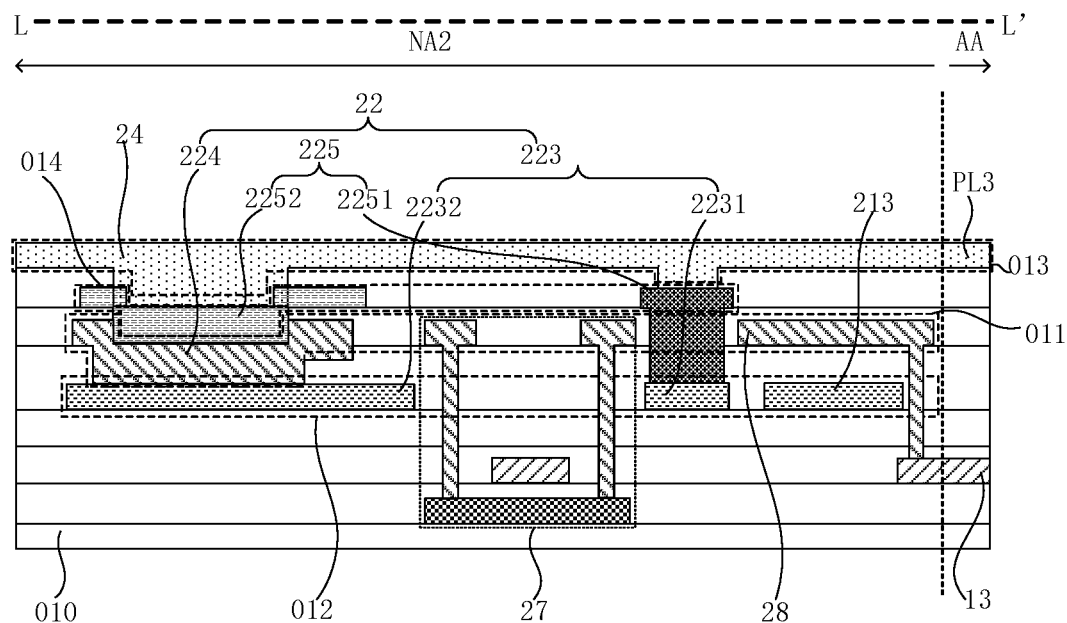
FIG. 35 is a partial cross-sectional view along an LL' direction shown in FIG. 33 according to another embodiment of the present disclosure.

FIG. 30 is a partial enlarged view of FIG. 1 according to another embodiment of the present disclosure, FIG. 31 is a partial cross-sectional view along an LL' direction shown in FIG. 30 according to an embodiment of the present disclosure, FIG. 32 is a partial cross-sectional view along an LL' direction shown in FIG. 30 according to another embodiment of the present disclosure, FIG. 33 is a partial enlarged view of FIG. 1 according to another embodiment of the present disclosure, FIG. 34 is a partial cross-sectional view along an LL' direction shown in FIG. 33 according to an embodiment of the present disclosure, and FIG. 35 is a partial cross-sectional view along an LL' direction shown in FIG. 33 according to another embodiment of the present disclosure.

As shown in FIGS. 30 to 35, in the second region NA2, the second conductive block 22 further includes a seventh portion 225 located in the fourth conductive layer 014. The fourth conductive layer 014 is located between the third conductive film layer 013 and the conductive layer where the fifth portion 223 is located. Along the thickness direction of the display panel, the second power line 24 is electrically connected to the fifth portion 223 through the seventh portion 225. That is, the seventh portion 225 can be regarded as a connecting electrode between the fifth portion 223 and the second power line 24, so that the risk of wire breakage in the through holes is avoided when there is a great distance between the layer where the second power line 24 is located and the layer where the seventh portion 225 is located.

Referring to FIG. 10 to FIG. 13, the seventh portion 225 can be provided in a same layer as the anode PL2, and the second power line 24 can be provided in a same layer as the cathode PL3. The seventh portion 225 can be provided in a same layer as the cathode PL3, and the second power line 24 can be provided in a same layer as the anode PL2. Hereinafter, the seventh portion 225 being provided in a same layer as the anode PL2 and the second power line 24 being provided in a same layer as the cathode PL3 is taken as an example.

In an embodiment of the present disclosure, as shown in FIG. 31 and FIG. 34, the conductive layer where the fifth portion 223 of the second conductive block 22 is located is located at a side of the conductive layer where the sixth portion 224 is located away from the substrate 010, and the seventh portion 225 is located at a side of the conductive layer where the fifth portion 223 is located away from the substrate 010, so that the fifth portion 223 can be connected to the seventh portion 225 through a via hole.

In an embodiment of the present disclosure, as shown in FIG. 32 and FIG. 35, the conductive layer where the fifth portion 223 of the second conductive block 22 is located is located at a side of the conductive layer where the sixth portion 224 is located close to the substrate 010, and the seventh portion 225 is located at a side of the conductive layer where the sixth portion 224 is located away from the substrate 010, so that the fifth portion 223 is electrically connected to the seventh portion 225 through the sixth portion 224.

In an embodiment of the present disclosure, referring to FIG. 30, FIG. 31 and FIG. 32, the second sub-portion 2232 of the fifth portion 223 is located at a side of the first sub-portion 2231 away from the display region AA. The seventh portion 225 overlaps with the second sub-portion 2232 and does not overlap with the first sub-portion 2231 along the thickness direction of the display panel.

In an embodiment of the present disclosure, since the second sub-portion 2232 is located at a side of the first sub-portion 2231 close to the edge of the display panel, the seventh portion 225 is provided at a position close to the edge of the display panel. Further, a portion of the seventh portion 225 electrically connected to the fifth portion 223 in the second region NA2 is located at a position close to the edge of the display panel in the second display NA2, so that the influence of the seventh portion 225 on the signal lines in the second region NA2 when extending to the display region AA is avoided.

In an embodiment of the present disclosure, referring to FIG. 33, FIG. 34, and FIG. 35, the seventh portion 225 includes a fourth sub-portion 2251 and a fifth sub-portion 2252. Along the second direction X, the distance between the fourth sub-portion 2251 and the fifth sub-portion 2252 is greater than 0. Along the thickness direction of the display panel, the fourth sub-portion 2251 overlaps with the first sub-portion 2231, and the fifth sub-portion 2252 overlaps with the second sub-portion 2232.

It can be understood that since the fourth sub-portion 2251 and the fifth sub-portion 2252 both belong to the seventh portion 225 of the second conductive block 22, the fourth sub-portion 2251 is electrically connected to the fifth sub-portion 2252.

The seventh portion 225 of the second conductive block 22 in the second region NA2 is configured as a structure including the fourth sub-portion 2251 and the fifth sub-portion 2252, so that the area of the seventh portion 225 is increased in the non-display region NA with a limited space, thereby reducing the resistance of the second conductive block 22.

In an embodiment of the present disclosure, the fourth sub-portion 2251 and the fifth sub-portion 2252 are both electrically connected to the second power line 24 and the fifth sub-portion 2252. That is, the fourth sub-portion 2251 overlapping with the first sub-portion 2231 and the fifth sub-portion 2252 overlapping with the second sub-portion 2232 both serve as a connecting electrode a connecting electrode between the second sub-portion 2232 and the second power line 24, so that the resistance between the second power line and the second conductive block 22 can be reduced.

In an embodiment of the present disclosure, as shown in FIG. 33 to FIG. 35, in the conductive layer where the seventh portion 225 is located, a second gap is formed between the fourth sub-portion 2251 and the fifth sub-portion 2252. That is, in the fourth conductive layer 014, the part located between the fourth sub-portion 2251 and the fifth sub-portion 2252 is a hollow portion. The second gap and at least partially overlaps with the region where the first gap is located.

Figure 36:
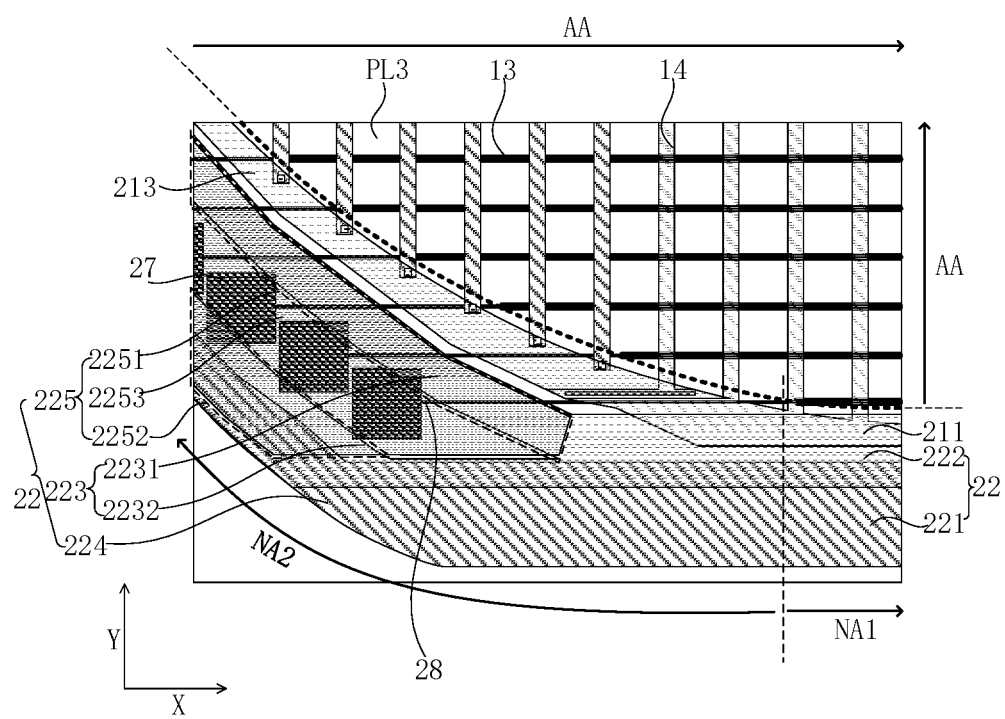
FIG. 36 is a partial enlarged view of FIG. 1 according to another embodiment of the present disclosure.
Figure 37:
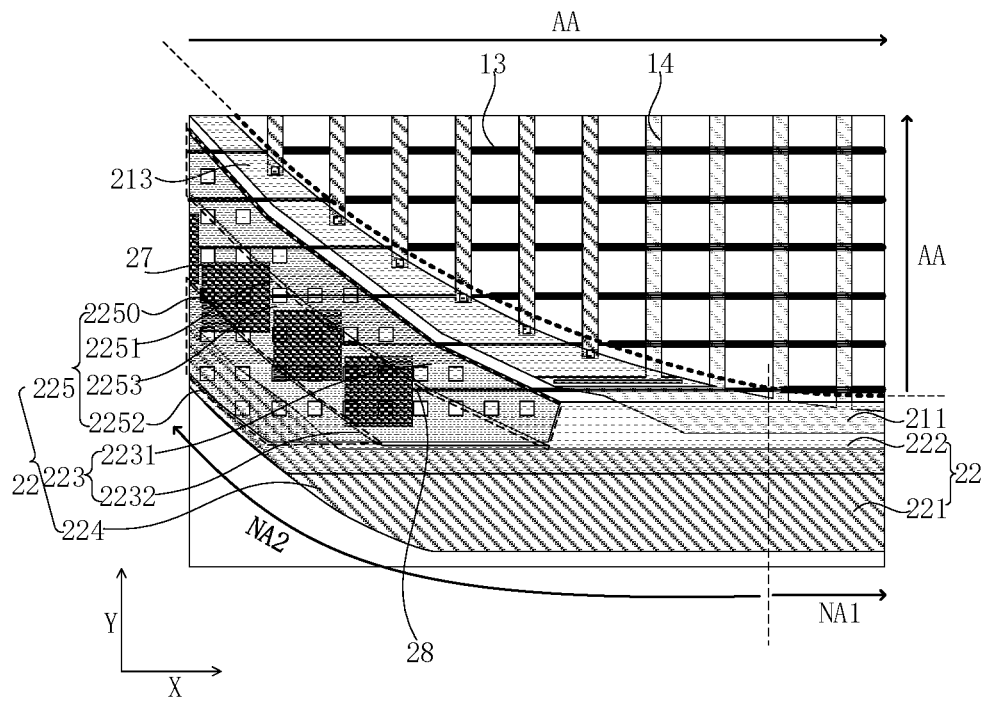
FIG. 37 is a partial enlarged view of FIG. 1 according to another embodiment of the present disclosure.

FIG. 36 is a partial enlarged view of FIG. 1 according to another embodiment of the present disclosure, and FIG. 37 is a partial enlarged view of FIG. 1 according to another embodiment of the present disclosure. To clearly illustrate the seventh portion, FIG. 36 and FIG. 37 do not illustrate the layer structure located above the conductive layer where the seventh portion is located.

As shown in FIG. 36 and FIG. 37, the seventh portion 225 further includes a sixth sub-portion 2253. The sixth sub-portion 2253 is located between the fourth sub-portion 2251 and the fifth sub-portion 2252 and is connected to the fourth sub-portion 2251 and the fifth sub-portion 2252. That is, the fifth portion 23 located in the second region NA2 is a continuous structure along the second direction X, and includes the portions at both sides of the driving circuit 27 and the portion above the layer where the driving circuit 27 is located, so that the area of the second conductive block 22 can be effectively increased.

In an embodiment of the present disclosure, as shown in FIG. 36, along the thickness direction of the display panel, the seventh portion 225 can completely cover the driving circuit 27.

In an embodiment of the present disclosure, as shown in FIG. 37, the seventh portion 225 located in the second region NA2 includes multiple through holes 2250. The through holes 2250 can serve as vent holes of the organic layer under the fourth conductive layer 014.

The through hole can be filled with a layer at a side of the fourth conductive layer 014 away from the substrate 010. For example, the through hole can be filled with a pixel definition layer, which can effectively protect the conductive layer of the through hole 2250.

Combining FIGS. 20, 23, 25, 27, 30, 33, 36, and 37 with FIGS. 1 and 2, the second region NA2 includes a chamfer region located in a position of the second region NA2 close to the first region NA1. The display region above the chamfer region shrinks inward in a direction away from the first region NA1 along the first direction Y with respect to the display region above the first region.

In an embodiment of the present disclosure, in the chamfer region, the second power line 24 is electrically connected and the fifth portion 223 through the seventh portion 225. In an embodiment of the present disclosure, the position where the second power line 24 is electrically connected to the fifth portion 223 and the seventh portion 225 is only located in the chamfer region.

In an embodiment of the present disclosure, as shown in FIGS. 20, 23, 25, 27, 30, 33, 36, and 37, in the chamfer region of the second region NA2, the first conductive block 21 includes an eighth portion 213 located at a side of the fifth portion 223 close to the display region AA.

In an embodiment of the present disclosure, the eighth portion 213 and the fifth portion 223 are located in a same conductive layer, and the eighth portion 213 is located between the first sub-portion 2231 and the display region AA, so that the eighth portion 213 located in the second region NA2 is electrically connected to the first portion 211 or the second portion 212 located in the first region NA1.

Figure 38:
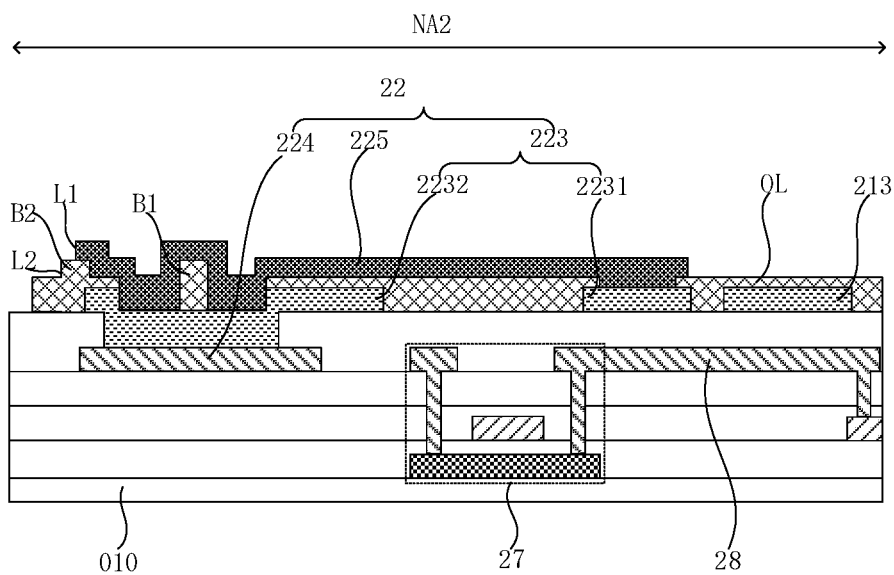
FIG. 38 is a cross-sectional view of a second region according to another embodiment of the present disclosure.

FIG. 38 is a cross-sectional view of a second region according to another embodiment of the present disclosure.

As shown in FIG. 38, the second region NA2 includes at least one blocking wall structure. The blocking wall structure includes a first organic structure. There is no first organic structure at both sides of the blocking wall structure. That is, along a direction parallel to a plane of the substrate 010, there are organic clearance regions (i.e., regions that do not include organic structures) at opposite sides of the blocking wall structure. Alternatively, the blocking wall structure is an island structure. For example, FIG. 38 illustrates two blocking wall structures B1 and B2 in the second region NA2. The first organic structures in the two blocking wall structures B1 and B2 are both located in the first organic layer OL. That is, the first organic layer OL is a discontinuous structure at a position close to the blocking wall structure. The blocking wall structure can prevent outside water and oxygen from invading the display region AA, and can extend the water and oxygen intrusion path, and thus prevent the devices in the display region AA from being eroded by water and oxygen.

In the second region NA2, an edge of the second conductive block 22 away from the display region AA is a first edge L1, that is, when an edge of any part of all the parts included in the second conductive block 22 is the farthest from the display region AA, the edge of this part is the first edge L1. For example, as shown in FIG. 38, when the second conductive block 22 in the second region NA2 includes the fifth portion 223, the sixth portion 224 and the seventh portion 225 simultaneously, the edge of the seventh portion 225 is farthest from the display region AA compared with the edges of the fifth portion 223 and the sixth portion 224, so that the edge of the seventh portion 225 away from the display region AA is the first edge L1.

An edge farthest from the display region AA in the at least one blocking wall structure provided in the second region NA2 is a second edge L2. For example, as shown in FIG. 38, the edge of the blocking wall structure B2 in the second region NA2 is farther away from the display region AA than the edge of the blocking wall structure B1, so that the edge of the blocking wall structure B2 farther away from the display region AA is the second edge L2.

In some embodiments of the present disclosure, the first edge L1 is located at a side of the second edge L2 close to the display region AA. That is, the fifth portion 223 in the second region NA2 does not go beyond the blocking wall structure. On the one hand, it can ensure that the edges of some conductive structures in the fifth portion 223 are protected from damage by processes such as etching and cutting; and on the other hand, the static electricity outside the display panel can be prevented from introducing into the display panel through the fifth portion 223.

Figure 39:
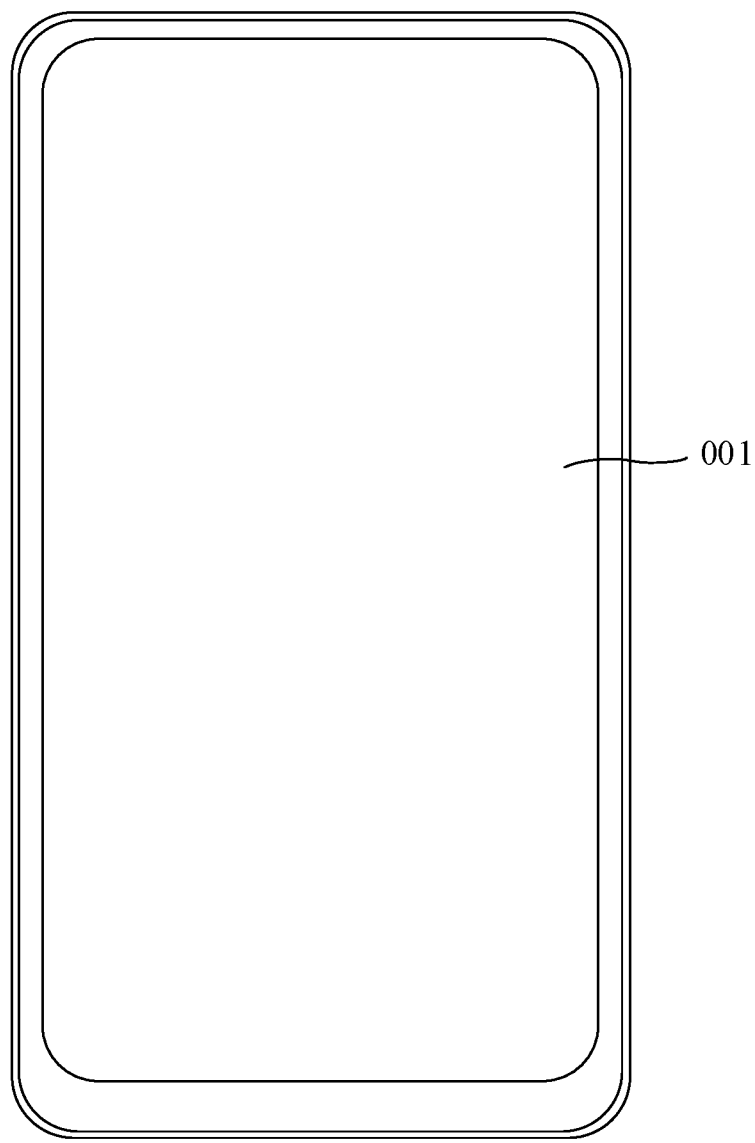
FIG. 39 is a schematic diagram of a display apparatus according to an embodiment of the present disclosure.

FIG. 39 is a schematic diagram of a display apparatus according to an embodiment of the present disclosure.

The present disclosure provides a display apparatus. As shown in FIG. 39, the display apparatus includes a display panel 001 provided in above embodiments. The display apparatus can be a mobile phone, a computer or a TV.

In the present disclosure, by overlapping the fourth portion of the second conductive block that is located in the second conductive layer with the first portion of the first conductive block that is located in the first conductive layer, the conductivity of the first conductive block and the conductivity of the second conductive block can be reasonably regulated in a limited space. When designing the display apparatus to reduce the border, an area compression degree of the second conductive block is greater than an area compression degree of the first conductive block in the first region. By extending the fourth portion of the second conductive block located in the second conductive layer to the first portion of the first conductive block located in the first conductive layer, so that excessive area compression of the second conductive block can be avoided from greatly impacting on the transmitted signal, the resistance of the second conductive block can be effectively reduced, and thus display effect of the display panel can be improved.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display panel, comprising:
    a substrate;
    a display region; and
    a non-display region comprising:
    a first region;
        a first power line;
        a second power line;
        a first conductive block electrically connected to the first power line; and
        a second conductive block electrically connected to the second power line;
    wherein the first region and the display region are arranged along a first direction;
    wherein in the first region, the first conductive block comprises a first portion and a second portion, and the second conductive block comprises a third portion and a fourth portion;
    wherein the first portion and the third portion are located in a first conductive layer, and the second portion and the fourth portion are located in a second conductive layer; and
    wherein the first portion is spaced apart from the third portion, the second portion is spaced apart from the fourth portion, and the fourth portion at least partially overlaps with the first portion along a direction perpendicular to a plane of the substrate.

2. The display panel according to claim 1, wherein the first portion comprises a first connecting portion adjacent to the display region;
    wherein the first connecting portion extends along a second direction, the third portion is located at a side of the first connecting portion away from the display region, and the second direction differs from the first direction; and
    wherein, along the direction perpendicular to the plane of the substrate, the first connecting portion at least partially overlaps with the second portion, and the first connecting portion at least partially overlaps with the fourth portion.

3. The display panel according to claim 1, further comprising a first organic layer, wherein the first conductive layer is arranged between the substrate and the second conductive layer, and the second conductive layer is arranged between the first organic layer and the first conductive layer; and in the first region, the first organic layer comprises an opening region, and the second portion and the fourth portion do not overlap with the opening region, or wherein the first conductive layer is arranged between the substrate and the second conductive layer; and along the direction perpendicular to the plane of the substrate, the fourth portion completely covers the third portion.

4. The display panel according to claim 1, wherein the non-display region further comprises a second region, the second region and the display region are arranged along a second direction, and the first direction differs from the second direction;

wherein in the second region, the second conductive block comprises a fifth portion, and the fifth portion is located in one of the first conductive layer and the second conductive layer;

wherein the fifth portion comprises a first sub-portion and a second sub-portion; and wherein, along the second direction, a distance between the first sub-portion and the second sub-portion is greater than 0.

5. The display panel according to claim 4, wherein the second region comprises a driving circuit, the first sub-portion is located at a side of the driving circuit close to the display region, and the second sub-portion is located at a side of the driving circuit away from the display region.

6. The display panel according to claim 5, wherein the display region comprises a scan line, and the driving circuit comprises an output terminal electrically connected to the scan line through a first connecting line; and wherein the first connecting line is located in one of the first conductive layer and the second conductive layer, and is located in a different layer from the fifth portion.

7. The display panel according to claim 5, wherein, in the second region, the second conductive block further comprises a sixth portion located at a side of the driving circuit away from the display region, and the sixth portion and the first connecting line are located in a same conductive layer.

8. The display panel according to claim 4, wherein, in the conductive layer where the fifth portion is located, a first gap is formed between the first sub-portion and the second sub-portion, and/or wherein the fifth portion further comprises a third sub-portion located between the first sub-portion and the second sub-portion, and the third sub-portion is connected to the first sub-portion and the second sub-portion.

9. The display panel according to claim 4, wherein the display region further comprises a light-emitting device, and the light-emitting device comprises a first electrode located in the third conductive layer;

wherein the second power line is located in the third conductive layer, and is electrically connected to the first electrode; and wherein, in the second region, the second power line is electrically connected to the fifth portion.

10. The display panel according to claim 9, wherein, in the second region, the second conductive block comprises a seventh portion located in a fourth conductive layer, and the fourth conductive layer is located between the third conductive layer and the conductive layer where the fifth portion is located; and wherein, along the direction perpendicular to the plane of the substrate, the second power line is electrically connected to the fifth portion through the seventh portion.

11. The display panel according to claim 10, wherein the second sub-portion is located at a side of the first sub-portion away from the display region; and wherein, along the direction perpendicular to the plane of the substrate, the seventh portion at least partially overlaps with the second sub-portion and does not overlap with the first sub-portion.

12. The display panel according to claim 11, wherein the seventh portion comprises a fourth sub-portion and a fifth sub-portion, and, along the second direction, a distance between the fourth sub-portion and the fifth sub-portion is greater than 0; and wherein, along the direction perpendicular to the plane of the substrate, the fourth sub-portion at least partially overlaps with the first sub-portion, and the fifth sub-portion at least partially overlaps with the second sub-portion.

13. The display panel according to claim 12, wherein the fourth sub-portion and the fifth sub-portion are electrically connected to the second power line and the fifth portion.

14. The display panel according to claim 12, wherein, in the fourth conductive layer, a second gap is formed between the fourth sub-portion and the fifth sub-portion.

15. The display panel according to claim 12, wherein the seventh portion further comprises a sixth sub-portion located between the fourth sub-portion and the fifth sub-portion, and the sixth sub-portion is connected to the fourth sub-portion and the fifth sub-portion.

16. The display panel according to claim 10, wherein the second region comprises a chamfer region located in the second region close to the first region, and wherein, in the chamfer region, the second power line is electrically connected to the fifth portion through the seventh portion.

17. The display panel according to claim 4, wherein the second region comprises at least one blocking wall structure, and the blocking wall structure comprises a first organic structure;

wherein, in the second region, an edge of the second conductive block away from the display region is a first edge, and an edge of the at least one blocking wall structure farthest from the display region is a second edge; and wherein the first edge is located at a side of the second edge adjacent to the display region.

18. The display panel according to claim 4, wherein the second region comprises a chamfer region; and wherein, in the chamfer region, the first conductive block comprises an eighth portion located at a side of the fifth portion close to the display region.

19. The display panel according to claim 18, wherein the eighth portion and the fifth portion are located in a same conductive layer.

20. A display apparatus, comprising a display panel, wherein the display panel comprises:
a substrate;
a display region; and
a non-display region comprising:
a first region;
a first power line;
a second power line;
a first conductive block electrically connected to the first power line; and a second conductive block electrically connected to the second power line;

wherein the first region and the display region are arranged along a first direction;

wherein, in the first region, the first conductive block comprises a first portion and a second portion, and the second conductive block comprises a third portion and a fourth portion;

wherein the first portion and the third portion are located in a first conductive layer, and the second portion and the fourth portion are located in a second conductive layer; and wherein the first portion is spaced apart from the third portion, the second portion is spaced apart from the fourth portion, and the fourth portion at least partially overlaps with the first portion along a direction perpendicular to a plane of the substrate.

* * * * *